(12) United States Patent     (10) Patent No.:   US 12,677,665 B2

Lin et al.            (45) Date of Patent:     Jul. 7, 2026

(54) SEMICONDUCTOR MEMORY DEVICES AND METHODS OF MANUFACTURING THEREOF

(71) Applicant: Taiwan Semiconductor Manfuacturing Company, Ltd., Hsinchu (TW)

(72) Inventors: Meng-Han Lin, Hsinchu (TW); Chia-En Huang, Xinfeng (TW)

(73) Assignee: Taiwan Semiconductor Manfuacturing Company, Ltd., Hsinchu (TW)

( * ) Notice: Subject to any disclaimer, the term of this patent is extended or adjusted under 35 U.S.C. 154(b) by 56 days.

(21) Appl. No.: 18/769,121

(22) Filed: Jul. 10, 2024

(65) Prior Publication Data

US 2024/0363555 A1    Oct. 31, 2024

Related U.S. Application Data

(60) Division of application No. 18/361,227, filed on Jul. 28, 2023, now Pat. No. 12,068,263, which is a (Continued)

(51) Int. Cl.
*H10W 42/00*      (2026.01)
*H10B 51/20*      (2023.01)

(52) U.S. Cl.
CPC ............ *H10W 42/00* (2026.01); *H10B 51/20* (2023.02); *H10W 42/121* (2026.01)

(58) Field of Classification Search
USPC ........................................................ 257/295
See application file for complete search history.

(56) References Cited

U.S. PATENT DOCUMENTS 10,115,681 B1   10/2018   Ariyoshi
2006/0001104 A1*   1/2006   Ookura ............. H01L 21/76224
                                        438/296

(Continued)

FOREIGN PATENT DOCUMENTS

TW      201214630 A     4/2012
TW      201834210 A     9/2018
TW      202101468 A     1/2021

OTHER PUBLICATIONS

Ex Parte Quayle Action on U.S. Appl. No. 17/458,778 DTD Feb. 2, 2023.

(Continued)

*Primary Examiner* — Bo B Jang
(74) *Attorney, Agent, or Firm* — Foley & Lardner LLP

(57) ABSTRACT

A method for fabricating memory devices includes forming a first portion of a memory device that includes a first device portion and one or more first interface portions. The first device portion includes a plurality of first memory strings, each of which includes a plurality of first memory cells vertically separated from one another. Each of the one or more first interface portions, laterally abutted to one side of the first device portion, includes a plurality of first word lines (WLs). The method further includes forming a plurality of first source lines (SLs) and a plurality of first bit lines (BLs) in the first device portion. The method further includes forming a first seal ring structure that laterally encloses both the first device portion and the first interface portion concurrently with forming the pluralities of SLs and BLs.

20 Claims, 17 Drawing Sheets

Related U.S. Application Data continuation of application No. 17/458,778, filed on Aug. 27, 2021, now Pat. No. 11,749,623.

(60) Provisional application No. 63/168,394, filed on Mar. 31, 2021.

(56) References Cited

U.S. PATENT DOCUMENTS

| | | | |
|---|---|---|---|
| 2010/0007024 A1* | 1/2010 | Uchikoshi | H01L 24/05 |
| | | | 257/737 |
| 2019/0074363 A1 | 3/2019 | Zhu | |
| 2019/0312057 A1 | 10/2019 | Park et al. | |
| 2022/0085052 A1 | 3/2022 | Watarai et al. | |
| 2022/0173251 A1 | 6/2022 | Samachisa et al. | |
| 2022/0285383 A1 | 9/2022 | Kubota et al. | |
| 2022/0310808 A1 | 9/2022 | Kajino et al. | |
| 2022/0406810 A1 | 12/2022 | Okuda | |

OTHER PUBLICATIONS

Ex Parte Quayle Action on U.S. Appl. No. 18/361,227 DTD Feb. 12, 2024.

Notice of Allowance on U.S. Appl. No. 17/458,778 DTD Apr. 17, 2023.

Notice of Allowance on U.S. Appl. No. 18/361,227 DTD Apr. 25, 2024.

Office Action issued in connection with Taiwan Appl. No. 111102894 dated Jan. 14, 2025.

* cited by examiner

FIG. 2A

200

Provide a substrate — 202

Form a plurality of transistors — 204

Form a plurality of metallization levels including a plurality of interconnect structures — 206

Form a stack including a plurality of insulating layers & plurality of sacrificial layers alternatively disposed on one another — 208

Pattern the stack to form a staircase profile — 210

Deposit IMD — 212

Form a plurality of trenches in a first direction — 214

Partially etch sacrificial layers — 216

Form word lines — 218

Form a plurality of memory layers — 220

Form a plurality of semiconductor channel layers — 222

SEMICONDUCTOR MEMORY DEVICES AND METHODS OF MANUFACTURING THEREOF

CROSS-REFERENCE TO RELATED APPLICATION

This application is a divisional application of U.S. patent application Ser. No. 18/361,227, filed Jul. 28, 2023, which is a continuation application of U.S. patent application Ser. No. 17/458,778, filed Aug. 27, 2021, which claims priority to and the benefit of U.S. Provisional Application No. 63/168,394, filed Mar. 31, 2021, each of which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-B are an example flow chart of a method for forming a memory device, in accordance with some embodiments.

DETAILED DESCRIPTION

Figure 1:
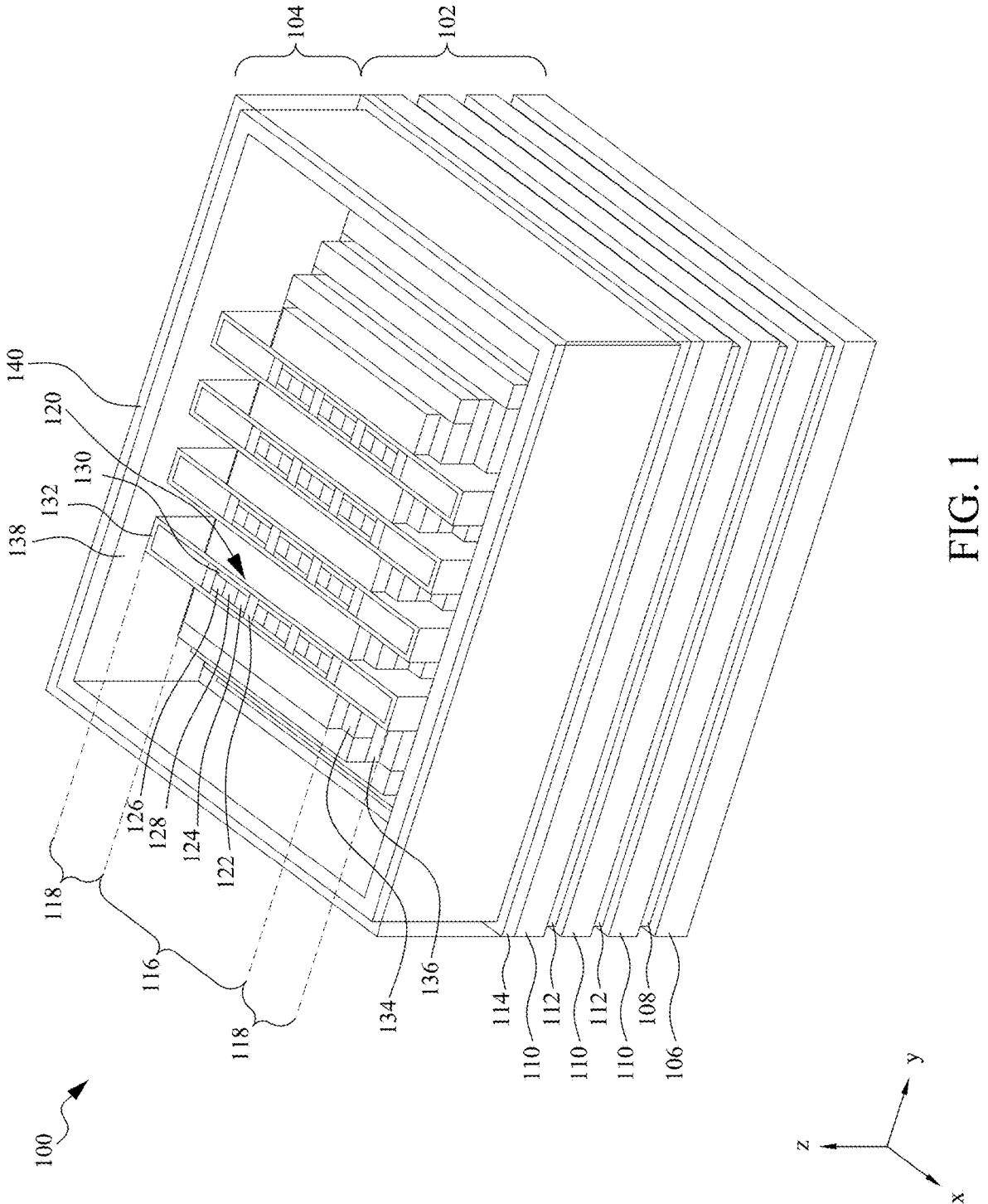
FIG. 1 is a perspective view of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a 3D memory device (sometimes referred to as a semiconductor device) includes a number of memory blocks. Each memory block includes at least one memory array (or sub-array) of memory cells formed in a stack of insulating layers and conductive layers. The array of memory devices are formed in a stack of insulating layers and gate layers and may include a plurality of gate layers. The memory cells are formed across multiple memory levels (or tiers) over a substrate. For example, each memory cell can be constituted by at least one of: a portion of a semiconductor channel layer that continuously extends along a vertical direction of the array, a portion of a memory film that continuously extends along the vertical direction, a first conductive structure (functioning as a drain electrode) that continuously extends along the vertical direction, a second conductive structure (functioning as a source electrode) that continuously extends along the vertical direction, and one of a plurality of third conductive structures (functioning as gate layers or gate electrodes) that continuously extend along a first lateral direction of the array. The drain electrode, source electrode, and gate layers may sometimes be referred to as "bit line (BL)," "source/select line (SL), and "word line (WL)," respectively.

In some cases, the memory block further includes an interface portion formed on either or both sides of the memory array to allow electrical connection to the memory cells included in the array. For example, the WLs may extend from the array (which is sometimes referred to as a device portion) and further along the interface portion(s). The WLs can have a staircase profile in the interface portion. A seal ring structure around a memory array is often used to enclose the device portion and the interface portion of the memory block and to avoid introducing die-sawing stress and contaminants such as moisture into the circuits of the enclosed device.

Embodiments of the present disclosure are described in the context of forming a seal ring structure for a memory device. In particular, the seal ring structure, that laterally encloses a device portion and an interface portion of the memory device, is formed concurrently with source lines (SLs) and bit lines (BLs) of the device portion. The seal ring structure can protect the memory device from die-sawing stress and contaminants such as moisture. By concurrently forming the seal ring structure with the SLs and BLs, the seal ring structure, SLs, and BLs include the same material. For example, the seal ring structures, SLs, and BLs can each be integrally formed as an one-piece structure with the same conductive material. As such, a substantial amount of processing resources and costs can be saved, which can advantageously increase the efficiency and yield of fabricating the memory device in a large scale.

FIG. 1 illustrates a perspective view of a memory device 100, in accordance with some embodiments. The memory device 100 includes a first vertical portion 102 and a second vertical portion 104. The first vertical portion 102 includes a plurality of transistors 106 and a plurality of metallization levels (or layers) 110 formed over the plurality of transistors 106. Between a bottommost of the metallization levels 110 and the transistors 106, the first vertical portion 102 includes at least a level having a plurality of contact structures 108. The plurality of contact structures 108 each electrically coupled one or more of the plurality of transistors 106 to one or more interconnect structures formed in the metallization levels 110. The plurality of metallization levels 110 are alternatively stacked with a plurality of via layers 112 that each include a plurality of via structures, which are sometimes referred to as interconnect structures as well. The memory device 100 may include an etch stop layer 114 over the plurality of transistors 106, the plurality of interconnect structures 108, the plurality of metallization levels 110, and the plurality of via layers 112, all of which constitute the first vertical portion 102, in various embodiments.

The second vertical portion 104 of the memory device 100 depicts a memory block (or a portion of a memory block). The memory block includes a device portion 116 and at least one interface portion 118. The memory block includes an array of memory cells 120 in the device portion 116. The memory block may be disposed on the etch stop layer 114, which can be a layer of one or more dielectric (e.g., silicon nitride) materials. When viewed from the top, such an array may be arranged in a column-row configuration, e.g., having a number of rows extending along a first lateral direction (e.g., the X-direction) and a number of columns extending along a second lateral direction (e.g., the Y-direction). Within each row, a number of memory cells 120 can be separated and electrically isolated from one another by an isolation structure 122. Each memory cell 120 includes or is coupled to a source line (SL) 124 and a bit line (BL) 126 that are separated and electrically isolated from each other by an inner spacer 128.

The memory device 100 includes one or more semiconductor channels 130. The semiconductor channel 130, extending along the vertical direction (e.g., the Z-direction), can be disposed along each of the opposite surfaces (or sidewalls) of the SL 124 and BL 126 in the Y-direction. Each semiconductor channel 130 can extend in the first lateral direction (e.g., the X-direction), with itself physically separated or electrically isolated from another semiconductor channel 130 within the row (along the X-direction).

The memory device 100 includes one or more memory films 132. The memory film 132, extending along the vertical direction (e.g., the Z-direction), can be disposed along a surface (or sidewall) of each semiconductor channel 130 opposite from the SL 124 and BL 126 in the Y-direction. The memory film 132 can extend in the first lateral direction (e.g., the X-direction).

As mentioned above, a number of memory cells 120 can be defined in the memory device 100. For example, each of the memory cells 120 can be constituted by a BL, a SL, a portion of a semiconductor channel, a portion of a memory film, and a word line (WL) (which will be discussed below). In the configuration of example FIG. 1, within one of the rows of the array, the number of memory cells 120 can be formed on the opposite sides of each pair of the BL and SL. For example, a first memory cell 120 can be partially defined by a portion of a memory film 132 and a portion of a semiconductor channel 130 disposed on one side of each pair of SL 124 and BL 126, and a second memory cell 120 can be partially defined by a portion of a memory film 132 and a portion of a semiconductor channel 130 disposed on the other side of that pair of SL 124 and BL 126. Alternatively stated, these two memory cells 120 may share one pair of BL and SL. Further, each row can extend along the vertical direction (e.g., the Z-direction) to include an additional number of memory cells, thereby forming a number of memory strings. It should be understood that the memory device 100 shown in FIG. 1 is merely an illustrative example, and thus, the memory device 100 can be formed in any of various other 3D configurations, while remaining within the scope of present disclosure.

The memory device 100 also includes a plurality of WLs 134 and a plurality of insulating layers 136 alternatively stacked on top of one another in the vertical direction (e.g., the Z-direction) which form a stack disposed on outer surfaces of the memory film 130 (along the Y-direction), such that the stack can be interposed between adjacent rows of memory cells 120. In some embodiments, a topmost layer and a bottommost layer of the stack may include an insulating layer 136 of the plurality of insulating layers 136. The bottommost insulating layer 136 may be disposed on the substrate. The stack may be patterned to form a staircase profile and overlaid with an intermetal dielectric material (IMD) 138. The staircase profile defines the interface portions 118 of the memory device 100.

Each of the plurality of WLs 134 extends in memory device 100 along the respective row of memory cells 120 along the first lateral direction (e.g. the X-direction). The insulating layers 136 may also extend along the first lateral direction (e.g., the X-direction). Two parallel WLs 134 may be located adjacent to each other in a second lateral direction that is perpendicular to the first lateral direction and in the same plane (e.g., the Y-direction), and may be interposed between two vertically separated insulating layers 136. In some embodiments, an adhesive layer may be interposed between the WLs 134 and the adjacent insulating layers 136, and facilitate adhesion of the WL 134 to the insulating layer 136, and may also serve as a spacer between two parallel WLs 134 that are interposed between the same vertically separated insulating layers 136. In some embodiments, the adhesive layer is optional.

The memory device 100 further includes a seal ring structure 140 that laterally encloses the device portion 116 and the interface portion 118. The seal ring structure 140 is formed concurrently with and essentially consists of the same material as the SLs 124 and the BLs 126. The seal ring structure 140 is laterally spaced apart from the device portion 116 and the interface portion(s) 118 with the IMD 138.

Figure 2B:
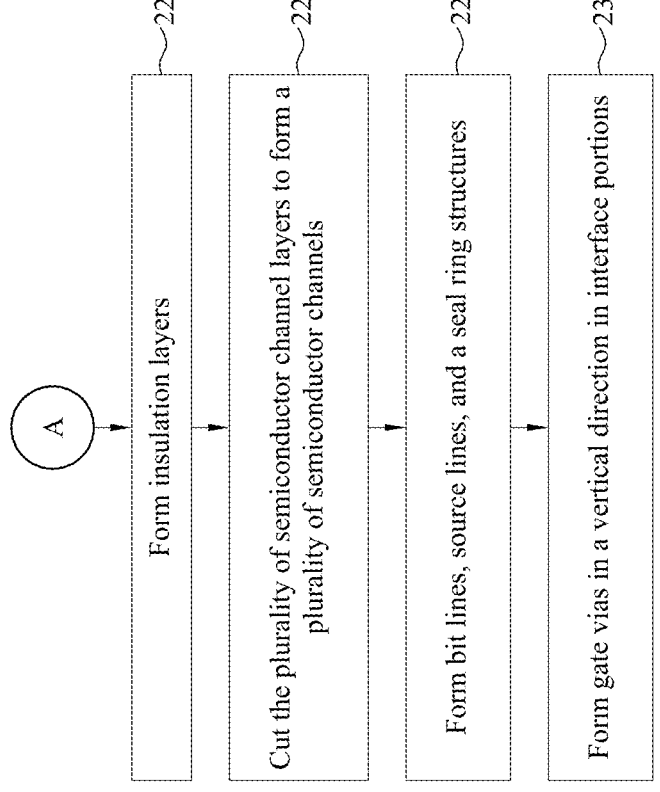

FIGS. 2A-B illustrate a flowchart of an example method 200 for forming at least a portion of a memory device 300 (e.g., the memory devices 100 described with respect to FIG. 1), in accordance with some embodiments. It should be noted that the method 200 is merely an example, and is not intended to limit the present disclosure. Accordingly, it is understood that the order of operation of the method 200 of FIGS. 2A-B can change, that additional operations may be provided before, during, and after the method 200 of FIGS. 2A-B, and that some other operations may only be described briefly described herein.

In some embodiments, operations of the method 200 may be associated with perspective views of the example memory device 300 at various fabrication stages as shown in FIGS. 3, 4, 5, 6, 7, 8, 9, and 10. In addition, the operations of the method 200 are equally applicable to any other memory device, for example, a memory device 400 shown in FIG. 11, a memory device 500 shown in FIG. 12, a memory device 600 shown in FIG. 13, or any other memory device. Although FIGS. 3-9 illustrate the memory device 300 including a plurality of memory cells, it should be understood the memory device 300, 400, 500, or 600 may include a number of other devices such as inductors, fuses, capacitors, coils, etc., which are not shown in FIGS. 3-13, for purposes of clarity of illustration.

In a brief overview, the method 200 may start with the operation 202 in which a semiconductor substrate is provided. The method 200 continues to operation 204 in which a plurality of transistors is formed. The method 200 continues to operation 206 in which a plurality of metallization levels including a plurality of interconnect structures are formed. The method 200 continues to operation 208 in which a stack including a plurality of insulating layers and a plurality of sacrificial layers alternatively disposed on one another are formed. The method 200 continues to operation 210 in which the stack to form a staircase profile is patterned. The method 200 continues to operation 212 in which an intermetal dielectric (IMD) is deposited.

The method 200 continues to operation 214 in which a plurality of first trenches in a first direction are formed. The method 200 continues to operation 216 in which the sacrificial layers are partially etched. The method 200 continues to operation 218 in which word lines are formed. The method 200 continues to operation 220 in which a plurality of memory layers are formed. The method 200 continues to operation 222 in which a plurality of semiconductor channel layers are formed. The method 200 continues to operation 224 in which insulation layers are formed. The method 200 continues to operation 226 in which the plurality of semiconductor channel layers are cut to form a plurality of semiconductor channels. The method 200 continues to operation 228 in which bit lines, source lines, and a seal ring structure are formed. The method 200 continues to operation 230 in which gate vias are formed in a vertical direction in the interface portions.

Figure 3:
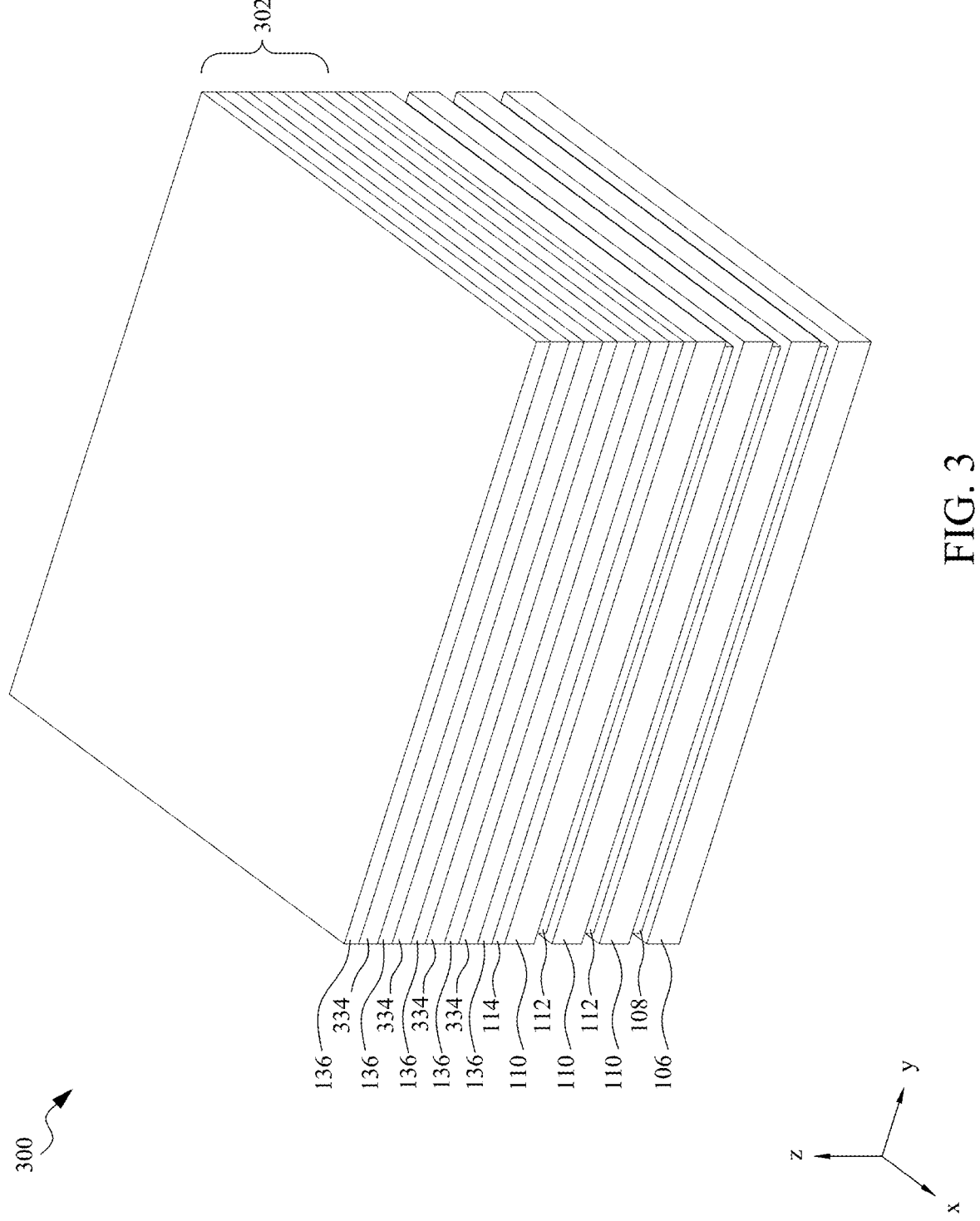
FIGS. 3, 4, 5, 6, 7, 8, 9, and 10 illustrate perspective views of an example memory device (or a portion of the example memory device) during various fabrication stages, made by the method of FIGS. 2A-B, in accordance with some embodiments.

Corresponding to operations 202-208 of FIG. 2, FIG. 3 is a perspective view of a memory device 300 including a substrate, a plurality of transistors 106, a plurality metallization levels 110, a plurality of interconnect structures 108, a plurality of via layers 112, and a stack 302, in accordance with some embodiments.

At operation 202, a substrate is provided. The substrate may be a semiconductor substrate, such as a bulk semiconductor, a semiconductor-on-insulator (SOI) substrate, any other suitable material, or the like, which may be doped (e.g., with a p-type or an n-type dopant) or undoped. The substrate may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, any other suitable layer, or any combinations thereof. The insulator layer is provided on a substrate, typically a silicon or glass substrate. Other substrates, such as a multi-layered or gradient substrate may also be used. In some embodiments, the semiconductor material of the substrate (not shown) may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

At operation 204, the plurality of transistors 106 are formed over the substrate. The plurality of transistors 106 may be comprised of a source structure, a drain structure, or a channel structure. The transistors may be formed by epitaxially growing a semiconductor material from any suitable method such as metal-organic CVD (MOCVD), molecular beam epitaxy (MBE), liquid phase epitaxy (LPE), vapor phase epitaxy (VPE), selective epitaxial growth (SEG), the like, or combinations thereof. The transistors may be p-type transistors, n-type transistors, or any other suitable transistor. At operation 206, the plurality of metallization levels 110 may be formed over the plurality of transistors 106. In some embodiments, each of the plurality of metallization levels 110 may include the plurality of interconnect structures 108 (such as MDs, VDs, or VGs) electrically coupled to one or more of the plurality of transistors 106. The interconnect structures 108 may be formed from a metal material such as tungsten, copper, gold, cobalt, ruthenium, any other suitable material, or combinations thereof. The interconnect structures 108 may be formed from any suitable method such as PVD, CVD, electroplating, electroless plating, or the like.

The plurality of metallization layers 110 (sometimes each referred to as M0, M1, M2, etc. . . . ) may be alternatively stacked with a plurality of via layers 112 (sometimes also referred to as interconnect structures). The vias layers 112 may electrically couple each of the metallization layers 110 to each other. While FIG. 3 shows three metallization layers 110 and two via layers 112, it is understood that any number of metallization layers 110 and via layers 112 can be formed. In various embodiments, if the number of metallization layers 110 is n, a number of via layers 112 may be n+−1.

At operation 208, the stack 302 is formed over the etch stop layer 114. The stack 302 includes a plurality of insulating layers 136 and a plurality of sacrificial layers 634 alternately stacked on top of each other in the vertical direction (e.g., the Z-direction). For example, one of the sacrificial layers 334 is disposed over one of the insulating layers 136, then another one of the insulating layers 136 is disposed on the sacrificial layer 334, so on and so forth. As shown in FIG. 3, a topmost layer (e.g., a layer distanced most from the etch stop layer 114) and a bottommost layer (e.g., a layer most proximate to the etch stop layer 114) of the stack 302 may include an insulating layer 136. While FIG. 3 shows the stack 302 as including five insulating layers 136 and four sacrificial layers 334, the stack 302 may include any number of insulating layers 136 and sacrificial layers 334 (e.g., 5, 6, 7, 8, or even more). In various embodiments, if the number of sacrificial layers 334 in the stack 302 is n, a number of insulating layers 136 in the stack 302 may be n+1.

Each of the plurality of insulating layers 136 may have about the same thickness, for example, in a range of about 5 nm to about 100 nm, inclusive. Moreover, the sacrificial layers 334 may have the same thickness or different thickness from the insulating layers 136. The thickness of the sacrificial layers 334 may range from a few nanometers to few tens of nanometers (e.g., in a range of 5 nm to 100 nm, inclusive). In some embodiments, the thickness of the insulating layers 136 and the sacrificial layers 334 may be any other suitable thickness.

The insulating layers 136 and the sacrificial layers 334 have different compositions. In various embodiments, the insulating layers 136 and the sacrificial layers 334 have compositions that provide for different oxidation rates and/ or different etch selectivity between the respective layers. The insulating materials that can be employed for the insulating layer 136 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. The sacrificial layers 334 may include an insulating material, a semiconductor material, or a conductive material. Non-limiting examples of the sacrificial layers 334 include silicon nitride, an amorphous semiconductor material (such as amorphous silicon), and a polycrystalline semiconductor material (such as polysilicon). In some embodiments, the insulating layers 136 may be formed from SiO, and the sacrificial layers 334 may be formed from SiN. The sacrificial layers 334 are merely spacer layers that are eventually removed and do not form an active component of the memory device 300.

In various embodiments, the insulating layers 136 and/or the sacrificial layers 334 may be grown over the etch stop layer 114. For example, each of the insulating layers 136 and the sacrificial layers 334 may be grown by a molecular beam epitaxy (MBE) process, a chemical vapor deposition (CVD) process such as a metal organic CVD (MOCVD) process, a furnace CVD process, an atomic layer deposition (ALD) process, and/or other suitable growth processes.

Figure 4:
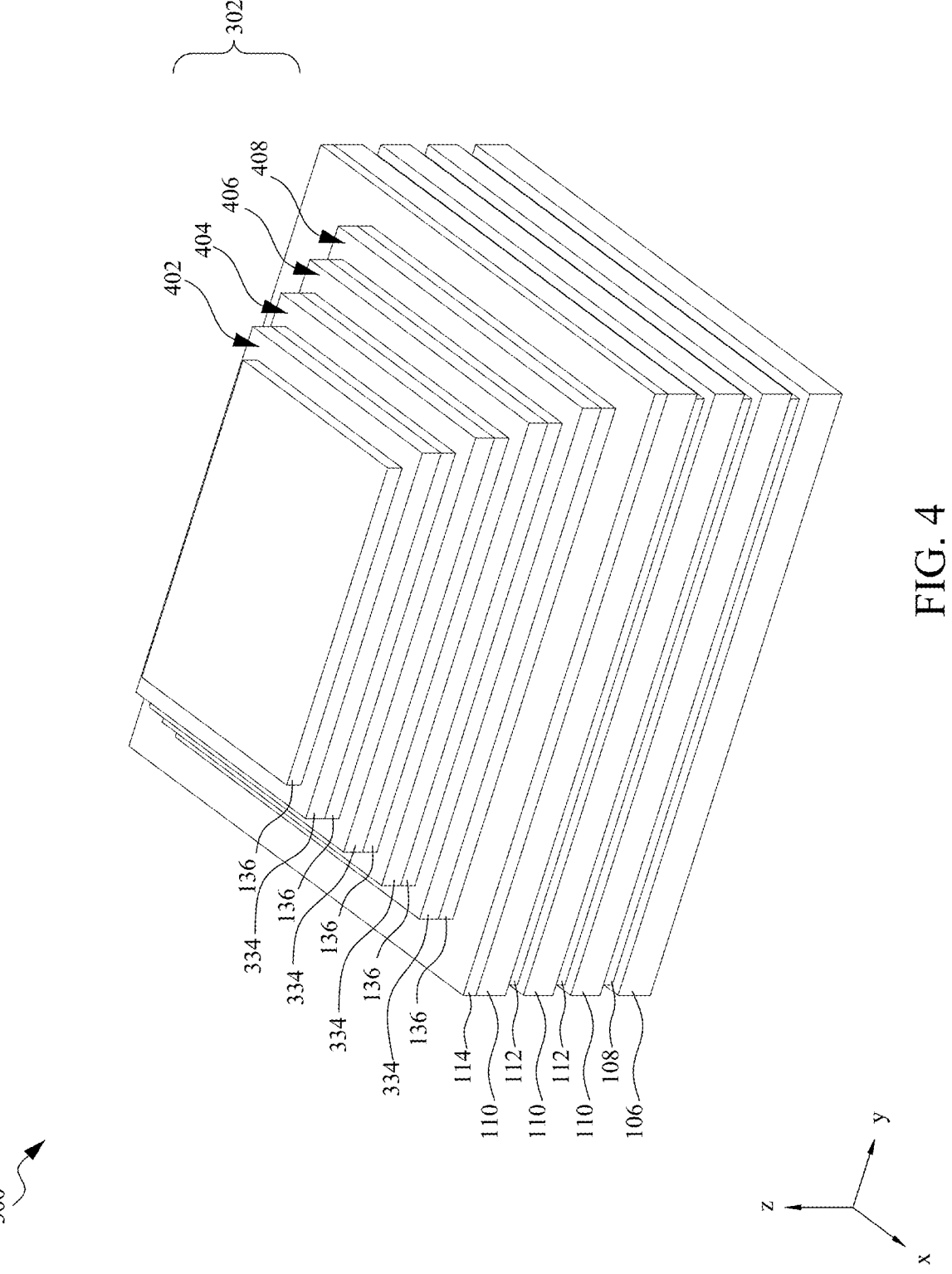

Corresponding to operation 210 of FIG. 2, FIG. 4 is a perspective view of the memory device 300 in which the stack 302 is patterned to form a staircase profile at one of the various stages of fabrication, in accordance with various embodiments.

To form the staircase profile, a mask layer (not shown) is deposited on the stack (on the topmost insulating layer 136), and is patterned. In some embodiments, the mask layer may include a photoresist (e.g., a positive photoresist or a negative photoresist), for example, a single layer or multiple layers of the same photoresist or different photoresists. In other embodiments, the mask layer may include a hard mask layer, for example, a polysilicon mask layer, a metallic mask layer, or any other suitable mask layer.

Next, the mask layer is patterned to etch portions of the mask layer at axial ends off the mask layer in the X-direction, for example, so as to reduce its axial width. The mask layer may be patterned using photolithography techniques. Generally, photolithography techniques utilize a photoresist material that forms the mask layer and that is deposited, irradiated (exposed), and developed to remove a portion of the photoresist material, in this instance, end portions of the mask layer. The remaining mask layer protects the underlying material, such as a portion of the stack 302 below the patterned mask layer, from subsequent processing steps, such as etching.

Next, respective portions of the topmost insulating layer 136 and the topmost sacrificial layer 334 on both sides of the mask layer in the X-direction, are etched. For example, the patterned mask layer is used to etch the exposed portions of the second topmost insulating layer 136 and the topmost sacrificial layer 334 so as to form a first step (or stair) 402 (out of the topmost sacrificial layer 334 and second topmost insulating layer 136) over the next lower sacrificial layer 334 and insulating layer 136 (i.e., the second topmost sacrificial layer 334 and third topmost insulating layer 136). In some embodiments, the etch may be an anisotropic etch (e.g., a reactive ion etch (RIE), neutral beam etch (NBE), deep reactive ion etch (DRIE), the like, any other suitable method, or combinations thereof) which selectively etches the exposed portions of the topmost insulating 136 and sacrificial layers 334.

In some embodiments, the etching may include a first etch that selectively etches the topmost insulating layer 136 until the underlying (e.g., topmost) sacrificial layer 334 is exposed, and a second subsequent etch that etches the sacrificial layer 334 until the underlying (e.g., second topmost) insulating layer 136 is exposed. Such two-step etching process may allow the underlying sacrificial layer or the insulating layer to serve as a etch stop such that once a portion of the layer immediately above it has been removed, so as to prevent over-etching.

Next, the mask layer is again etched to reduce its axial width in the X-direction, followed by the two-step etching process to form a second step 404 (out of the third topmost insulating layer 136 and second topmost sacrificial layer 334). By iteratively performing the width reduction process on the mask layer and the two-step etching process, the stack 302 can be patterned to include a number of steps (e.g., steps 402, 404, 406, and 408), which results in the staircase profile as shown in FIG. 4. In some embodiments, all of the insulating layers 136 and sacrificial layers 334 are etched to expose the etch stop layer 114.

Figure 5:
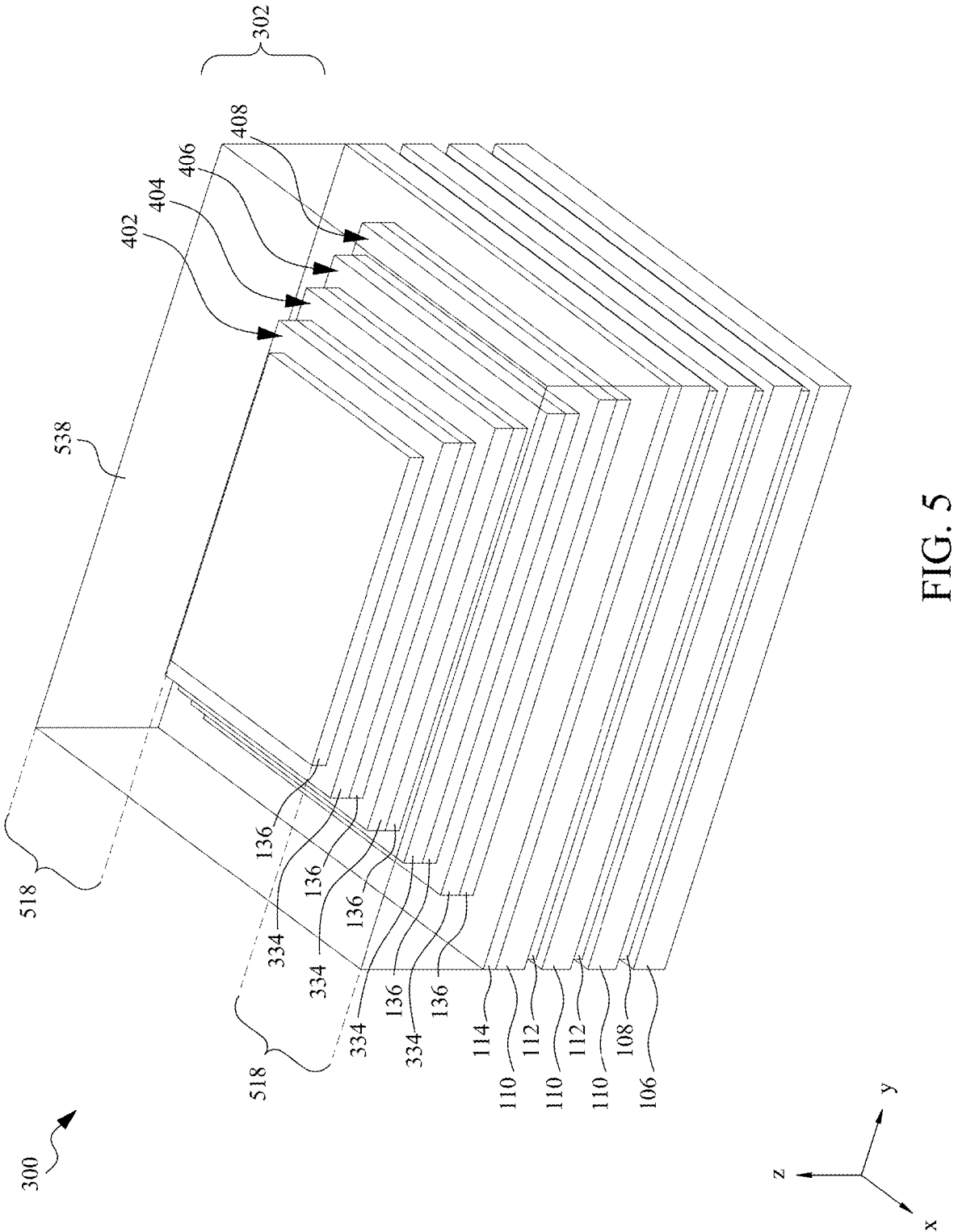

Corresponding to operation 212 of FIG. 2, FIG. 5 is a perspective view of the memory device 300 in which an IMD 538 is formed over the stack 302 (having the staircase profile) at one of the various stages of fabrication, in accordance with various embodiments.

The IMD 538 can be formed by depositing a dielectric material in bulk over the partially formed memory device 300, and polishing the bulk oxide back (e.g., using CMP) to the level off the topmost insulating layer 136, such that the IMD 538 is disposed only over the steps 402-408. The dielectric material of the IMD 538 may include SiO, phosphosilicate glass (PSG), borosilicate glass (BSG), boron-doped phosphosilicate Glass (BPSG), undoped silicate glass (USG), any other suitable material, or combinations thereof. Moreover, a portion of the memory device 300 comprising the staircase steps 402-408 and the IMD 538 can be defined as the interface portion(s) 518.

Figure 6:
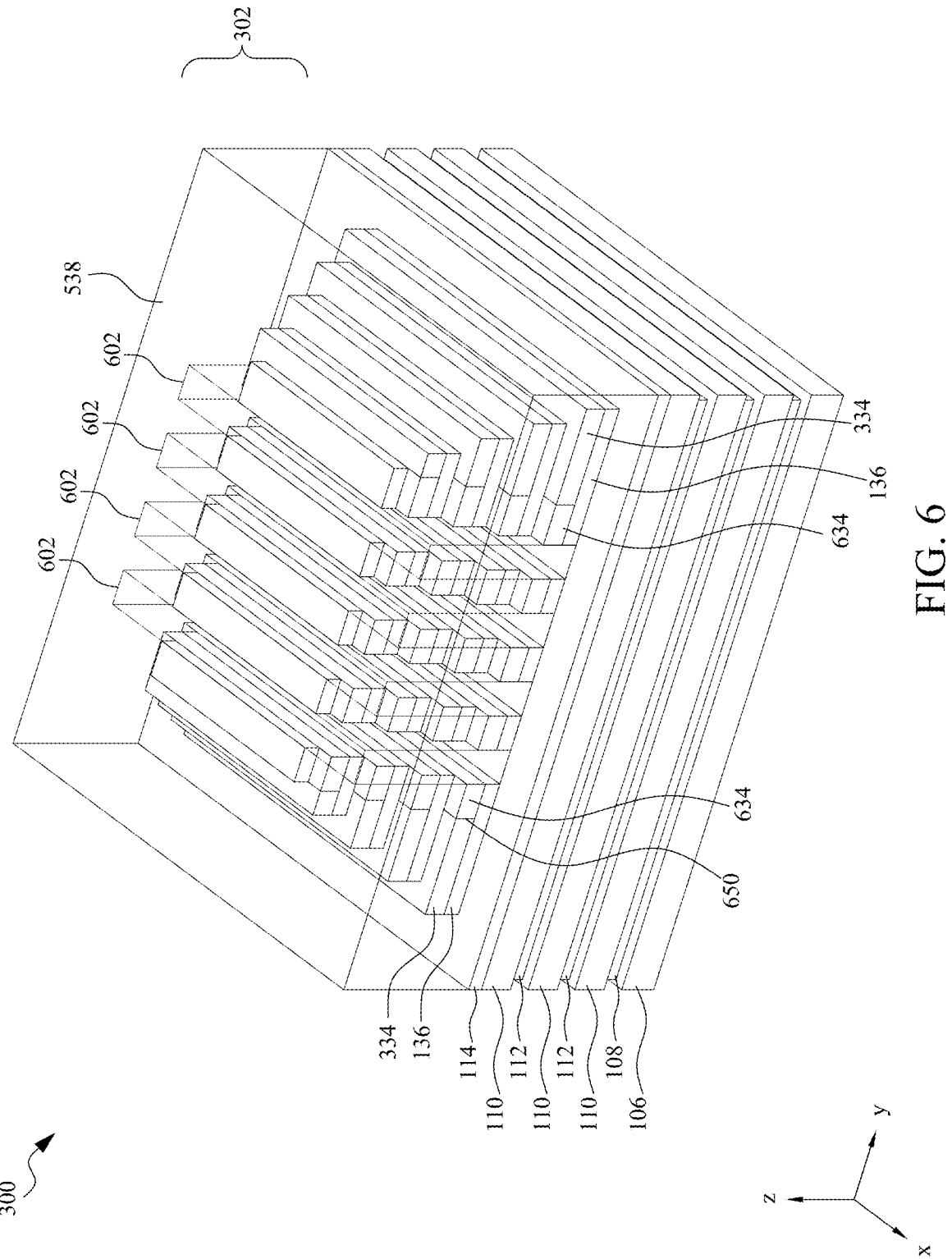

Corresponding to operations 214-218 of FIG. 2, FIG. 6 is a perspective view of the memory device 300 with a plurality of trenches 602 formed and word lines 634 are formed extending in the X-direction, in accordance with some embodiments. Although four trenches 602 are shown in the embodiment of FIG. 6, it should be understood that the memory device 300 can include any numbers of first trenches 602, while remaining within the scope of the present disclosure.

At operation 214, plurality of trenches 602 extending in the X-direction, have been formed through the stack 302 up to the etch stop layer 114 by etching the stack 302 in the Z-direction. The etching process for forming the plurality of trenches 602 may include a plasma etching process, which can have a certain amount of anisotropic characteristic. For example, the trenches 602 may be formed, for example, by depositing a photoresist or other masking layer on a top surface of the memory device 300, i.e., the top surface of the topmost insulating layer 136 of the stack 302, and a pattern corresponding to the trenches 602 defined in the masking layer (e.g., via photolithography, e-beam lithography, or any other suitable lithographic process).

The trenches 602 may be formed using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the trenches 602.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 6, the etch used to form the plurality of trenches 602 etches through each of the sacrificial layers 334 and insulating layers 136 of the stack 302 such that each of the plurality of trenches 602 extend form the topmost insulating layer 136 through the bottommost insulating layer 136 to the etch stop layer 114. In other embodiments, a hard mask may be used. In some embodiments, the trenches 602 may be formed with a varying width along, the Y-direction. In some embodiments, the trenches 602 may be etched with an increasing width as the height of trench 602 increases in the Z-direction, as shown in FIG. 6. In some embodiments, the upper portion of the trench 602 may be exposed to more etchants in order to create the varying width.

At operation 216 of FIG. 2, the exposed surfaces of the sacrificial layers 334 within the trenches 602 are partially etched so as to reduce a width of the sacrificial layers relative to the insulating layers 136 in the stack 302 (not shown). The exposed surfaces extend in the X-direction, and etching the exposed surfaces of the sacrificial layers 334 reduces a width of the insulating layers 136 on either side of the sacrificial layers 334 in the Y-direction. In some embodiments, the sacrificial layers 334 may be etched using a wet etch process (e.g., hydrofluoric etch, buffered hydrofluoric acid). In other embodiments, the exposed surfaces of the sacrificial layers 334 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers 334 in the Y-direction reduces a width of the sacrificial layers 334 relative to the insulating layers 136 disposed in the stack 302 such that first cavities are formed whose boundaries are formed by top and bottom surfaces of adjacent insulating layers 136 and a surface of the partially etched sacrificial layers 334 that face the first trenches 602 and extend in the X-direction (not shown).

In some embodiments, an adhesive layer 650 is then formed on sidewalls of the cavities. In some embodiments, the adhesive layer 650 is optional. In various embodiments, the adhesive layers 650 may include a material that has good adhesion with each of the insulating layers 136, the sacrificial layers 334, and the WLs 634, for example, Ti, Cr, etc. In some embodiments, the adhesive layer 650 may include e.g., titanium (Ti), chromium (Cr), or any other suitable adhesive material. The adhesive layers 650 may be deposited using any suitable method including, for example, molecular beam deposition (MBD), atomic layer deposition (ALD), PECVD, and the like. In some embodiments, the adhesive layer 650 may have a thickness in a range of 0.1 nm to 5 nm, inclusive or any other suitable thickness.

At operation 218, a plurality of WLs 634 are formed in the first cavities located in the trenches 602. The exposed edges of the word lines 634 may be etched back such that the edges of the WLs 634 facing the trenches are axially aligned in the Z-direction with corresponding edges of the insulating layers 136 disposed adjacent thereto, as shown in FIG. 6.

In various embodiments, the WLs 634 are formed by filling a gate metal in the cavities over the optional adhesive layer 650, such that the WLs 634 inherit the dimensions and profiles of the cavities. The WLs 634 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The WLs 634 can be formed by overlaying the workpiece with the above-listed metal material by, for example, chemical vapor deposition (CVD), physical vapor deposition (PVD), electroless plating, electroplating, any other suitable method, or combinations thereof.

Although each WL 634 shown in FIG. 6 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt (sometimes referred to as Vth) is achieved in the device that is to be formed. The work function layer(s) may be deposited by CVD, physical vapor deposition (PVD), ALD, and/or other suitable processes.

Formation of the WLs 634 in the cavities may cause edges of the WLs 634 in the Y-direction to protrude outwards of the cavities, i.e., outwards of the corresponding edges of the insulating layers 136, and/or the material forming the WLs 634 may also be deposited on exposed surfaces of the insulating layers 136 that face the trenches 602 and/or the etch stop layer 114. The protruding edges of the WLs 634 are etched, for example, using a selective wet etching or dry etching process (e.g., RIE, DRIE, etc.) until any gate material deposited on the surfaces of the insulating layers 136 and/or the etch stop layer 114, and edges of the WLs 634 facing the first trenches 602 are substantially axially aligned with corresponding edges of the insulating layers 136.

Figure 7:
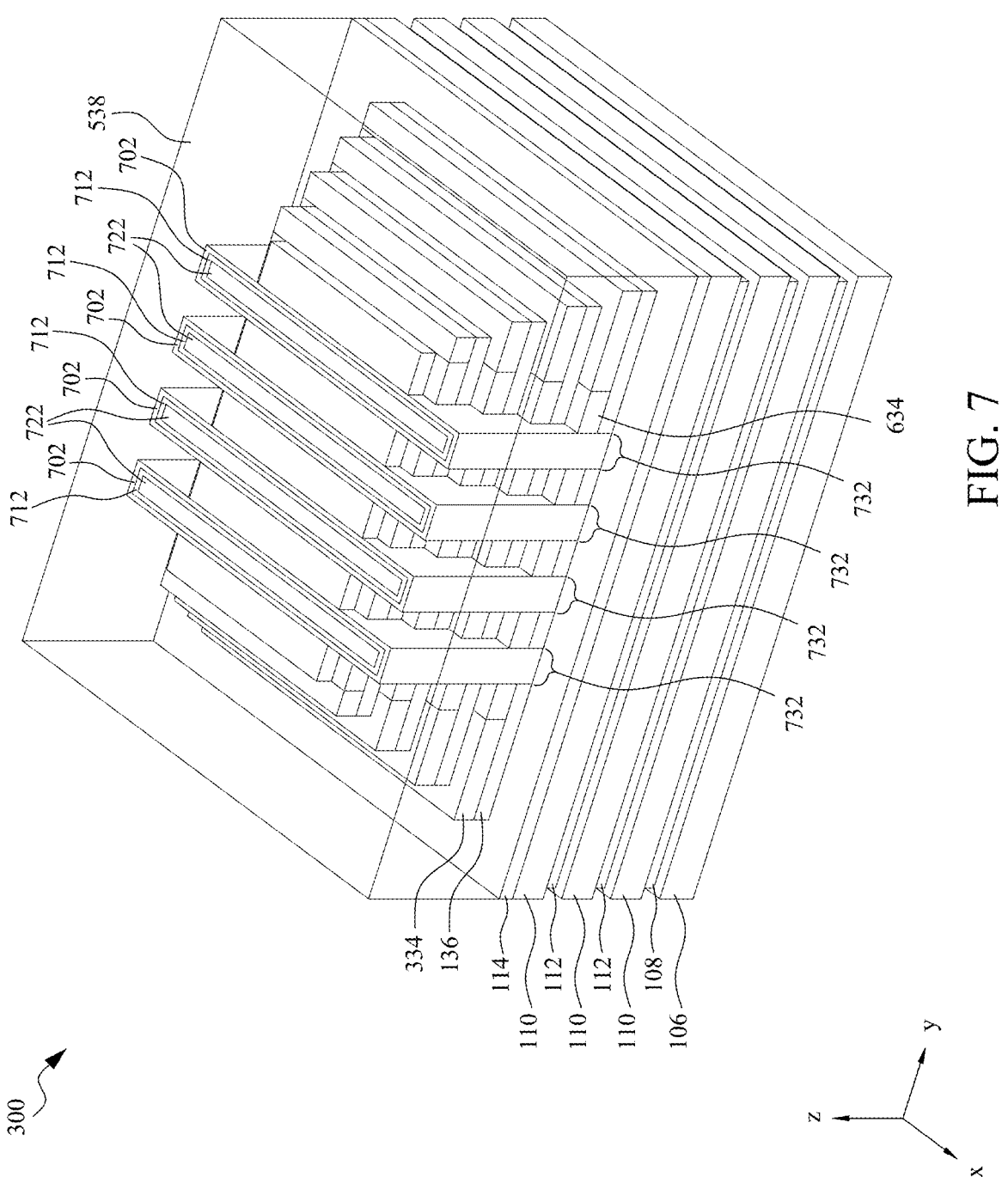

Corresponding to operations 220-224 of FIG. 2, FIG. 7 is a perspective view of the memory device 300 in which a plurality of memory layers 702, a plurality of semiconductor channel layers 712, and insulation layers 722 are formed in each of the plurality of trenches such that the plurality of memory layers 702, the plurality of semiconductor channel layers 712, and the insulation layers 722 continuously extend along the X-direction, in accordance with some embodiments.

At operation 220, the plurality of memory layers 702 are formed and continuously extend along the X-direction. The memory layers 702 may include a ferroelectric material, for example, lead zirconate titanate (PZT), $PbZr/TiO_3$, $BaTiO_3$, $PbTiO_2$, or combinations thereof, etc. However, it should be understood that the memory layers 702 can include any of various other materials that are suitable as in memory devices, while remaining within the scope of the present disclosure. For example, the memory layers 702 can include a material selected from the group consisting of: $HfO_2$, $Hr_{1-x}Zr_xO_2$, $ZrO_2$, $TiO_2$, $NiO$, $TaO_x$, $Cu_2O$, $Nb_2O_5$, $AlO_x$, and combinations thereof. The memory layers 702 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the memory layers 702 are continuous on the walls of the trenches 602 in the Z-direction. In some embodiments, a CMP operation may be performed after forming the memory layers 702 so that they will lie in the same X-Y plane or are level with a top surface of the topmost insulating layer 136. In various embodiments, each of the memory layers 702 includes two portions, each of which is formed to extend along one of the sidewalls of a corresponding trench. As such, each portion of the memory layer is in contact with a corresponding number of WLs 634 (through their respective exposed sidewalls). After formation, the memory layers 702 may sometimes be referred to as memory films.

At operation 222, the plurality of semiconductor channel layers 712 are formed within each of the plurality of trenches on exposed surfaces of the plurality of memory layers 702 such that the plurality of semiconductor channel layers 712 continuously extend along the X-direction. In some embodiments, the semiconductor channel layers 712 may be formed from a semiconductor material, for example, silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. The semiconductor channel layers 712 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the semiconductor channel layers 712 are continuous on the inner surface of the memory layers 702. In some embodiments, a CMP operation may be performed after forming the semiconductor channel layers 712 so that they will lie in the same X-Y plane or are level with a top surface of the topmost insulating layer 136. Over the memory layer, each of the channel layers 712 also includes two portions that are in contact with the two portions of a corresponding memory layer, respectively.

At operation 224, the plurality of insulation layers 722 are formed within each of the plurality of trenches 602 by filling each of the plurality of trenches 602 with an insulating material such that a plurality of first device segments 732 that include the memory layers 702, the semiconductor channels 712, and the insulation layers 722 are formed in the memory device 100 and extend in the first direction parallel to each other.

Each of the trenches is filled with an insulating material (e.g., $SiO_2$, $SiN$, $SiON$, $SiCN$, $SiC$, $SiOC$, $SiOCN$, the like, other suitable materials, or combinations thereof) so as to form the insulation layers 722. In some embodiments, the insulation layers 722 may be formed from the same material as the plurality of insulating layers 136 (e.g., $SiO_2$). The insulation layers may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof, a high aspect ratio process (HARP), another applicable process, or combinations thereof. A CMP process may then be performed after forming the insulation layers 722 so that they will lie in the same X-Y plane or are level with a top surface of the topmost insulating layer 136.

Figure 8:
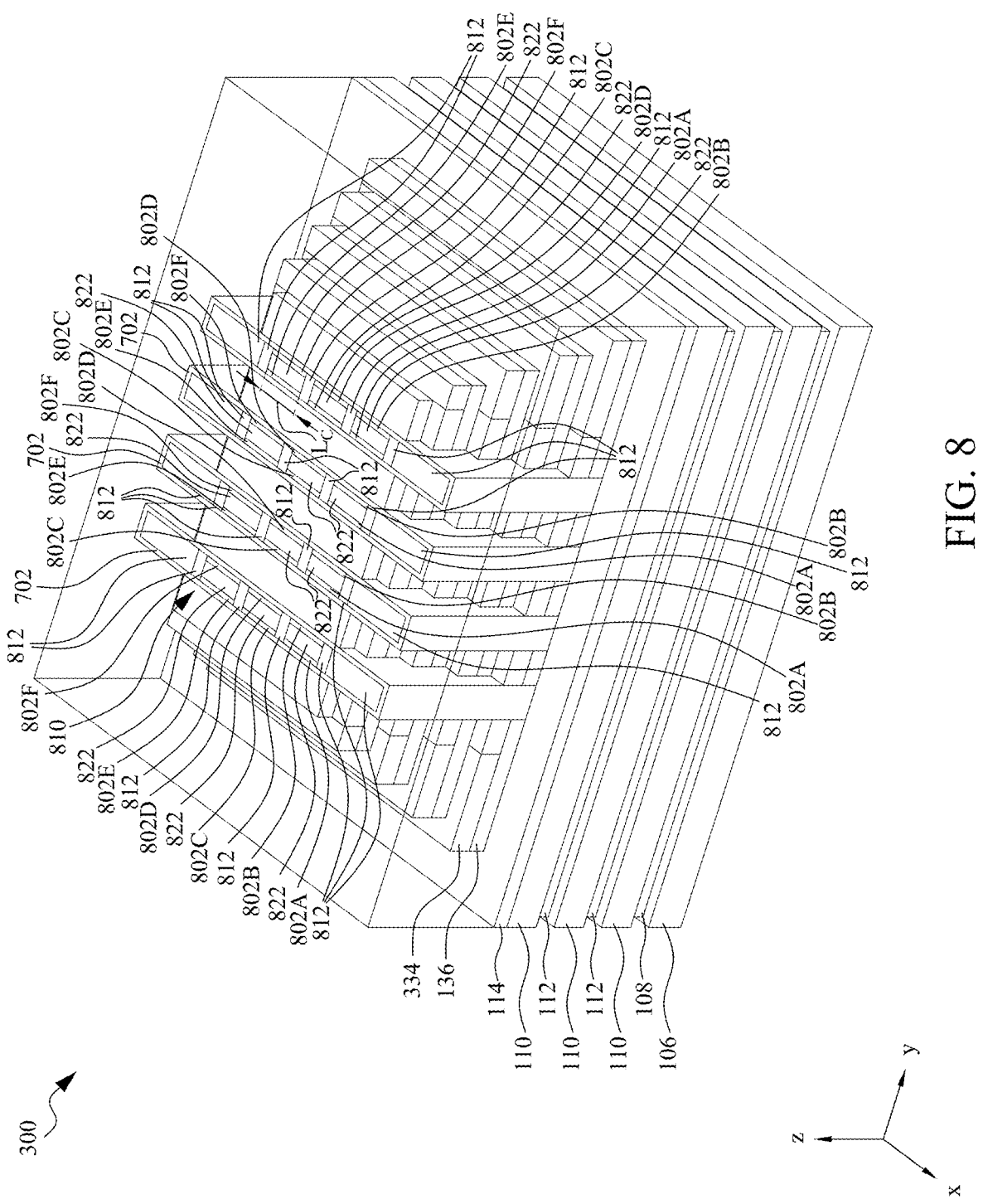

Corresponding to operation 226 of FIG. 2, FIG. 8 is a perspective view of the memory device 300 in which the semiconductor channel layers 712 are cut along the X-direction to form semiconductor channels 802A-F (sometimes referred to as semiconductor channel films), isolation structures 812 are formed, and inner spacers 822 are formed.

The semiconductor channel layers 712 are patterned by, for example, an anisotropic etching process to form a number of channel segments 802A, 802B, 802C, 802D, 802E, and 802F. Other methods of patterning the semiconductor channel layers 712 are within the scope of the present disclosure. In various embodiments, each of the channel segments 802A-F may extend along the X-direction with a length (Lc), which may be configured to define the physical channel length of a memory cell. Each channel segment defines the initial footprint of a memory string. Thus, a plurality of partially-formed memory cells 810 that include the memory layers 702, the semiconductor channels 802A-F, and the insulation layers are formed in the memory device 300, and extend in the X-direction parallel to each other.

The isolation structures 812 are formed to separate the semiconductor channels 802A-F into portion such that the semiconductor channels 802A-F are included in each memory cell 810 and fill any cavities formed from the patterning. Each partially-formed memory cell 810 includes an inner spacer 822 formed from a portion of the insulation layer extending between adjacent isolation structures 812 in the X-direction, in accordance with some embodiments. The semiconductor channels 802A-F are disposed on outer surfaces of the inner spacers 822 in the X-direction.

Figure 9:
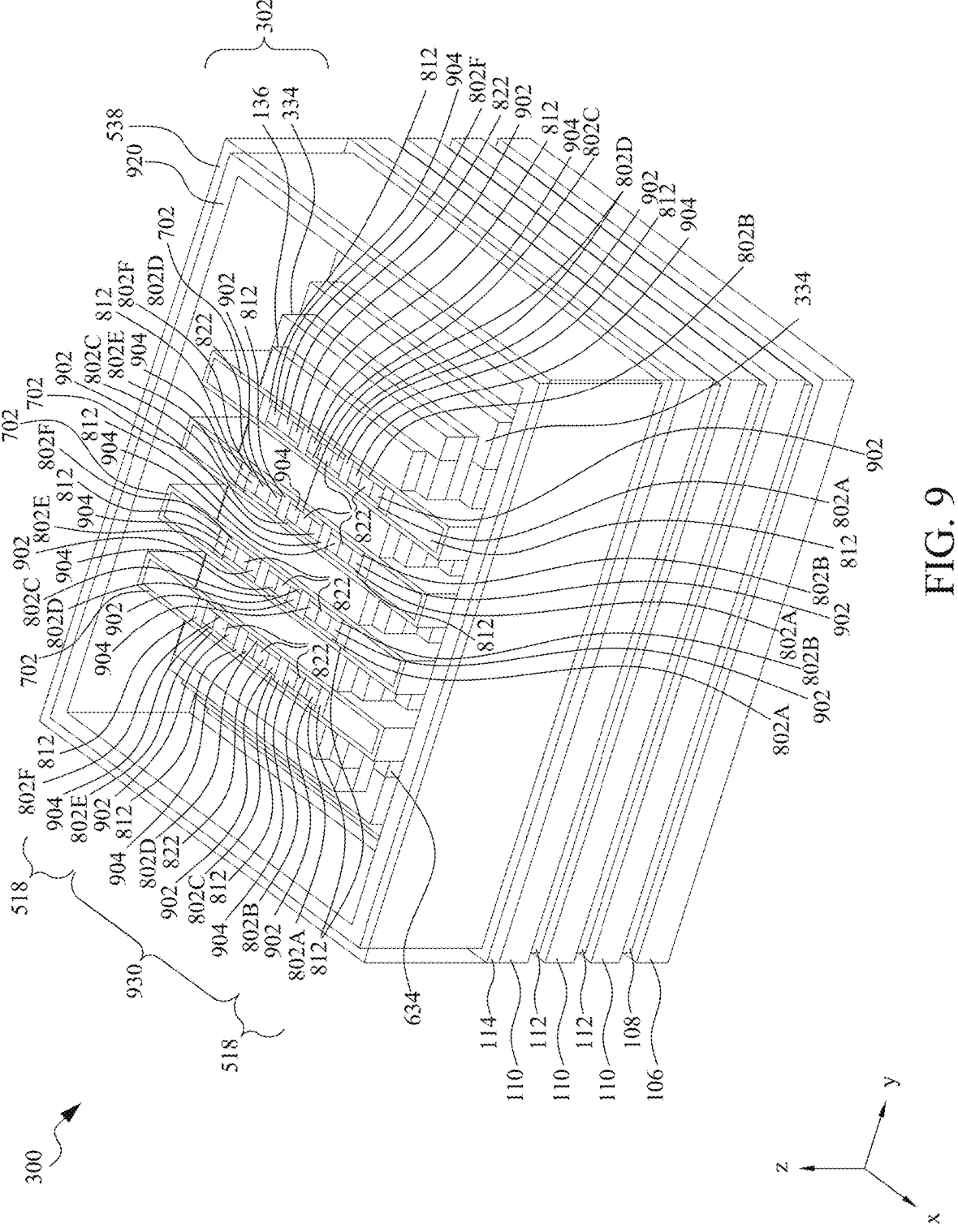

Corresponding to operation 228 of FIG. 2, FIG. 9 is a perspective view of the memory device 300 in which a plurality of source lines (SLs) 902 and a plurality of bit lines (BLs) 904 are formed to form memory cells 910, and a seal ring structure 920 is formed, in accordance with some embodiments. In some embodiments, a SL or BL may sometimes be referred to as an access line. However, it should be understood that, in some embodiments, the SLs and the BLs may be coupled to different levels of (e.g., voltage) signals, when operating the memory device.

The inner spacers 822 may be patterned to define initial footprints of a number of SLs 902 and BLs 904. The patterning generates trench portions by first etching through axial ends of the inner spacers 822 to the etch stop layer 114. The axial ends of the inner spacers 822 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Next, the SLs 902 and the BLs 904 may be formed, for example, using an epitaxial layer growth process to fill the trench portions with a continuously formed metal material such that the SLs 902 and the BLs 904 are located on opposite axial ends of the inner spacers 822, each extending from the etch stop layer 114 to a top surface of the inner spacers 822, as shown in FIG. 9. The SLs 902 and the BLs 904 may be formed in contact with end portions of a sidewall of the semiconductor channels 802A-F. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the SLs 902 and the BLs 904 may be formed with a continuously formed semiconductor material such as silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The SLs 902 and BLs 904 can be formed by overlaying the workpiece (e.g., to fill the recesses) with the above-listed material by, for example, chemical vapor deposition (CVD), physical vapor deposition (PVD), electroless plating, electroplating, any other suitable material, or combinations thereof. In some embodiments, a control deposition step may be performed for forming the SLs 902 and the BLs 904 such that the deposition step is stopped when a height of the SLs 902 and the BLs 904 in the Z-direction are equal to a height of the stack 302. In other embodiments, a CMP operation may be performed after formation of the SLs 902 and the BLs 904 so as to ensure a top surface of each of the topmost insulating layer 136, the memory layers 702, the semiconductor channels 802A-F, the inner spacers 822, the SLs 902, and the BLs 904 lie in the same X-Y plane or are level with a top surface of the topmost insulating layer 136. In other embodiments, a top surface of the SLs 902 and the BLs 904 may be higher than a top surface of the topmost insulating layer 136. In some other embodiments, the top surface of the SLs 902 and the BLs 904 may be lower than the top surface of the topmost insulating layer 136. After formation, each of the SLs 902 and BLs 904 is in contact with one of the plurality of first semiconductor channel films 802A-F.

The memory cell 910 is one memory cell from the memory device 300 and comprises a portion of the WL 634, the SL 902, the bit line 904, a portion of the semiconductor channel 802E, and a portion of the memory layer 702. Another memory cell 912 may be formed from the memory device 300 and comprises a portion of the WL 634, the SL 902, the BL 904, a portion of the semiconductor channel 802F, and a portion of the memory layer 702. The memory cells may be vertically separated from one another. A plurality of memory cells arranged along the Z-direction can form a memory string. A plurality of memory strings can form a memory block.

The seal ring structure 920 is formed concurrently with the plurality of SLs 902 and BLs 904. Thus, the seal ring structure 920 is made from the same material as the SLs 902 and the BLs 904. The IMD 538 may be patterned to define a seal ring trench that laterally encloses both the device portion 930 which consists of the memory array and the interface portions 518. The patterning generates a seal ring trench by etching through the IMD 538 to the etch stop layer 114. The seal ring trench is laterally spaced apart from a portion of the memory device which includes the device portion 930 and the interface portions 518 with the IMD 538. The seal ring trench may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

The seal ring structure 920 may be formed, for example, using an epitaxial layer growth process to fill the seal ring trench with a continuously formed metal material or semiconductor material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, any other suitable material, or combinations thereof. The semiconductor material can be selected from the group consisting of silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, the seal ring structure 920 may be made from the same material as the SLs 902 and the BLs 904. In some embodiments, the seal ring structure 920 may be made from a material different from the material of the SLs 902 and the BLs 904.

The seal ring structure 920 may be formed by overlaying the trench with the above-listed material by, for example, chemical vapor deposition (CVD), physical vapor deposition (PVD), electroless plating, electroplating, any other suitable material, or combinations thereof. In some embodiments, a control deposition step may be performed for forming seal ring structure 920 such that the deposition step is stopped when a height of the seal ring structure 920 in the Z-direction is equal to a height of the stack 302. In other embodiments, a CMP operation may be performed after formation of the seal ring structure 920 so as to ensure a top surface of the seal ring structure 920 lies in the same X-Y plane or are level with a top surface of the topmost insulating layer 136. In other embodiments, a top surface of the seal ring structure 920 may be higher than a top surface of the topmost insulating layer 136. In some other embodiments, the top surface of the seal ring structure 920 may be lower than the top surface of the topmost insulating layer 136.

In some embodiments, a second seal ring structure may be formed from the same process as the first seal ring structure 920 that encloses and is laterally spaced from the first seal ring structure 920. The second seal ring structure may be laterally spaced from the first seal ring structure with the IMD 538. The second seal ring structure may be formed, for example, using an epitaxial layer growth process to fill trench portions with a continuously formed metal material or semiconductor material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, any other suitable material, or combinations thereof. The semiconductor material can be selected from the group consisting of silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, the second seal ring structure may be made from the same material as the SLs 902, the BLs 904, and the first seal ring structure 920. In some embodiments, the second seal ring structure may be made from a material different from the material of the SLs 902, the BLs 904, and the first seal ring structure 920.

Figure 10:
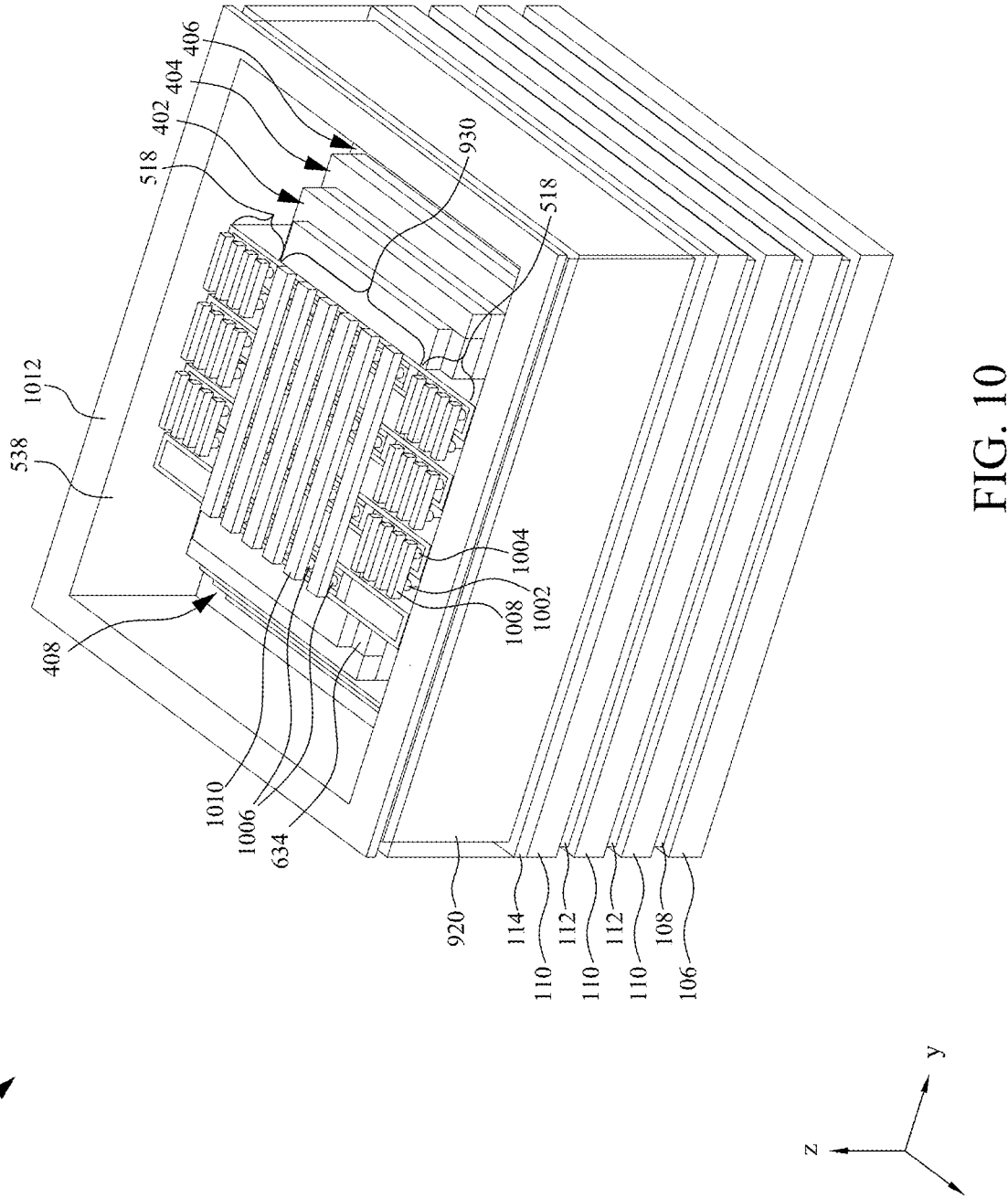

Corresponding to operation 230 of FIG. 2, FIG. 10 is a perspective view of the memory device 300 in which a plurality of WL staircase vias 1002, a plurality of WL vias 1004, a plurality of access lines vias 1006, a plurality of interface metal routings 1008, a plurality of device metal routings 1010, and a seal ring metal routing 1012 are formed, in accordance with some embodiments.

The memory device 300 is comprised of a device portion 930 (substantially similar to the device portion 116 in FIG. 1) and one or more interface portion(s) 518 (substantially similar to the interface portions 118 in FIG. 1). WL staircase vias 1002 are formed in the interface portions 518 on exposed portions of the WLs 634. The WL staircase vias 1002 each penetrate through the IMD 538 with a respective height (or depth) to land on a respective word line. For example, a number of WL staircase vias 1002 vertically extends with a first height to land on the WLs 634 at the first step 402; a number of WL staircase vias 1002 vertically extends with a second height to land on the WLs 634 at the second step 404; a number of WL staircase vias 1002 vertically extends with a third height to land on the WLs 634 at the third step 406; and a number of WL staircase vias 1002 vertically extends with a fourth height to land on the WLs 634 at the fourth step 408. The WL staircase vias 1002 are formed by etching the IMD 538 to form a number of openings that expose various portions of the WLs 634 at different steps, and then filled out with the openings with a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof.

Concurrently with or subsequently to forming the WL staircase vias 1002, WL vias 1004 are formed in a similar manner to the WL staircase vias 1002. Next, interface metal routings 1008 are formed to electrically couple the WL staircase vias 1002 to the WL vias 1004. Each of the interface metal routings 1008 are formed as a horizontal conductive line, as shown in FIG. 10. Similar as the WL staircase vias 1002, such interface metal routings 1008 and WL vias 1004 can be formed through a dual-damascene or single-damascene process by forming one or more horizontal and vertical trenches extending through an IMD and filling those trenches with a metallic fill material. The metallic fill material include at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof.

Concurrently with or subsequently to forming the WL staircase vias 1002 or WL vias 1004, access line vias 1006 are formed in the device portion 930 on exposed portions of the SLs 902 and BLs 904. The access line vias 1006 vertically extend to land on a respective SL 902 or BL 904. The access line vias 1006 are formed in a similar manner to the WL staircase vias 1002. Next, device metal routings 1010 are formed to electrically couple the access line vias 1006. In some embodiments, the device metal routings 1010 may be formed to couple multiple SLs 902 together along the Y-direction. Similarly, the device metal routings 1010 may be formed to couple multiple BLs 904 along the Y-direction. Each of the device metal routings 1010 are formed as a horizontal conductive line, as shown in FIG. 10. Similar as the WL staircase vias 1002, such device metal routings 1010 and access line vias 1006 can be formed through a dual-damascene or single-damascene process by forming one or more horizontal and vertical trenches extending through an IMD and filling those trenches with a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof.

Concurrently with or subsequently to forming the WL staircase vias 1002, a seal ring metal routing 1012 may be formed on exposed portions of the seal ring structure 920. The seal ring metal routing 1012 may be formed horizontally and continuously along both the X-direction and the Y-direction. In some embodiments, seal ring vias may optionally be formed to vertically extend and land on the seal ring structure 920. Similar to the WL staircase vias 1002, such seal ring metal routings 1012 and seal ring vias can be formed through a dual-damascene or single-damascene process by forming one or more horizontal or vertical trenches extending through the IMD and filling those trenches with a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof.

Upon forming the staircase vias 1002, the WL vias 1004, the access line vias 1006, the interface metal routings 1008, the device metal routings 1010, and the seal ring metal routing 1012, each of the WLs 634, SLs 902, BLs 904, and seal ring structure 920 can be electrically coupled to a memory core control circuit. The memory core control circuit can provide different voltage levels of bias to the WLs 634, the SLs 902, the BLs 904, the seal ring structure 920, and any other subsequent seal ring structure.

Figure 11:
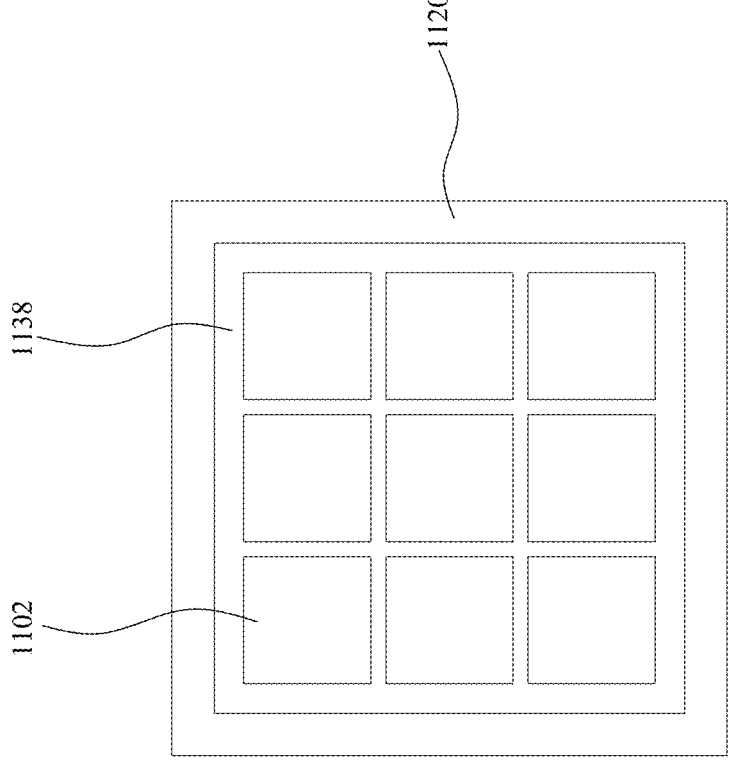
FIG. 11 illustrates a top view of an example memory device with a single seal ring structure, in accordance with some embodiments.

FIG. 11 is a top view of an example memory device 400 with a single seal ring structure 1120 enclosing multiple memory arrays, in accordance with some embodiments.

The memory device 400 can be formed from the method 200 from FIG. 2. The memory device 400 is substantially similar to the memory device 300 except that the memory device 400 includes nine 3D memory arrays 1102 enclosed by the seal ring structure 1120. In contrast, the memory device 300 includes one 3D memory array.

Each memory array 1102 includes memory cells formed from a SL, a BL, a portion of semiconductor channel, a memory layer, and a portion of a WL that are similar to the SLs 902, the BLs 904, the semiconductor channels 802A-F, the memory layers 702, and the WLs 634 of the memory device 300, respectively. Each memory array 1102 may be laterally spaced from another memory array in both the X-direction and the Y-direction by an IMD 1138. The IMD 1138 is substantially similar to the IMD 538. The nine memory arrays 1102 may be laterally enclosed by the seal ring structure 1120 that is substantially similar to the seal ring structure 920 of the memory device 300. The seal ring structure 1120 is laterally spaced from 3D memory arrays 1102. It is understood that the number of memory arrays 1102 enclosed by the seal ring structure 920 is not limited to nine but can be any number of memory arrays (e.g., 1, 3, 5, 7, 8, 9, 10, etc.).

Figure 12:
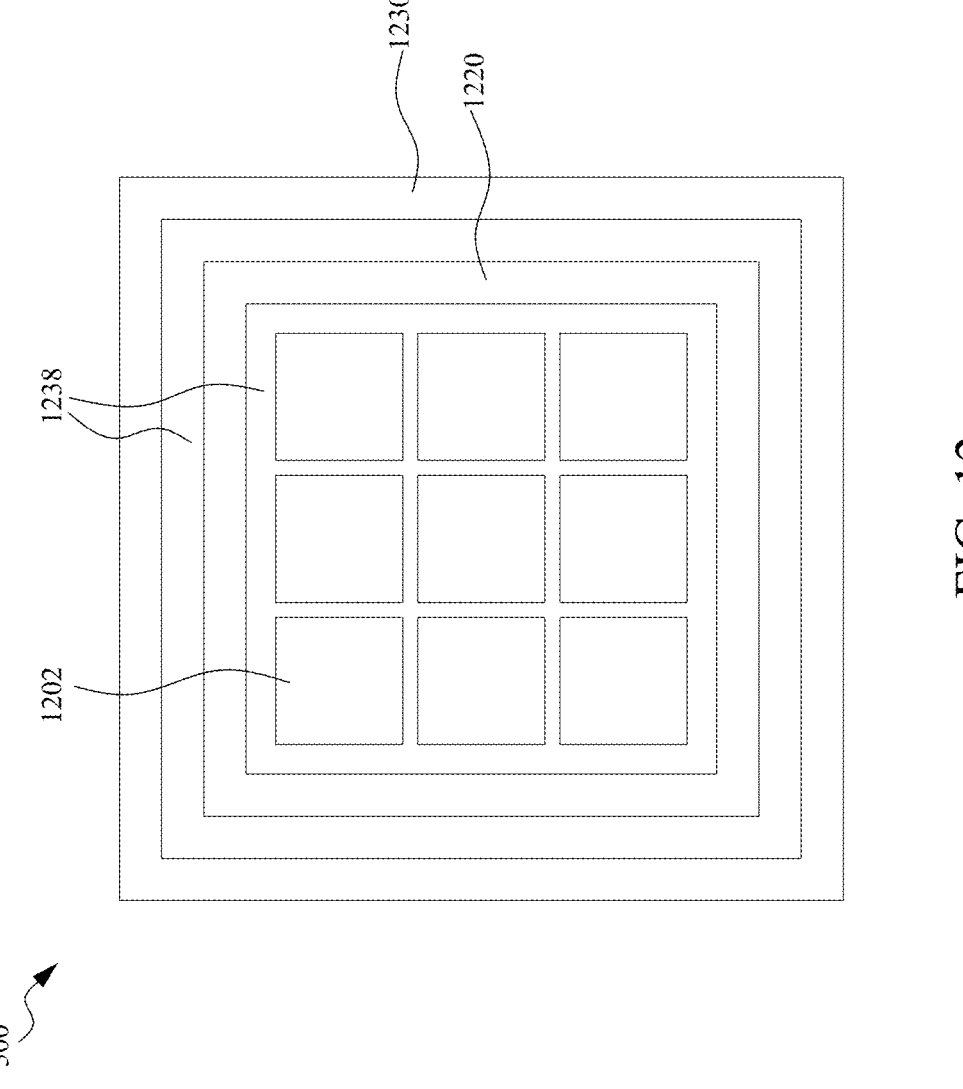
FIG. 12 illustrates a top view of an example memory device with two seal ring structures, in accordance with some embodiments.

FIG. 12 is a top view of an example memory device 500 with a first seal ring structure 1220 and a second seal ring structure 1230, in accordance with some embodiments.

The memory device 500 is formed from the method 200 from FIG. 2. The memory device 500 is substantially similar to the memory device 300 but with nine 3D memory arrays 1202 and the second seal ring structure 1230. In contrast, the memory device 300 includes one 3D memory array and a single seal ring structure.

Each memory array 1202 includes memory cells formed from a SL, a BL, a portion of semiconductor channel, a memory layer, and a portion of a WL that are similar to the SLs 902, the BLs 904, the semiconductor channels 802A-F, the memory layers 702, and the WLs 634 of the memory device 300, respectively. Each memory array 1202 may be laterally spaced from another memory array in both the X-direction and the Y-direction by an IMD 1238. The IMD 1238 is substantially similar to the IMD 538. The nine memory arrays 1202 may be laterally enclosed by the first seal ring structure 1220 that is substantially similar to the seal ring structure 920 of the memory device 300. The first seal ring structure 1220 is laterally spaced from 3D memory arrays 1202 by the IMD 1238. The nine memory arrays 1202 and the first seal ring structure 1220 are laterally enclosed by the second seal ring structure 1230 that is formed from the same process as the seal ring structure 920 from the memory device 300. The second seal ring structure 1230 is laterally spaced from the first seal ring structure 1220 by the IMD 1238. It is understood that the number of memory arrays 1202 enclosed by the first seal ring structure 1220 and the second seal ring structure 1230 is not limited to nine but can be any number of memory arrays (e.g., 1, 3, 5, 7, 8, 9, 10, etc.). In some embodiments, there may be more than two seal ring structures surrounding a number of memory arrays such as 3, 4, 5, 6, 7, or more seal ring structures.

Figure 13:
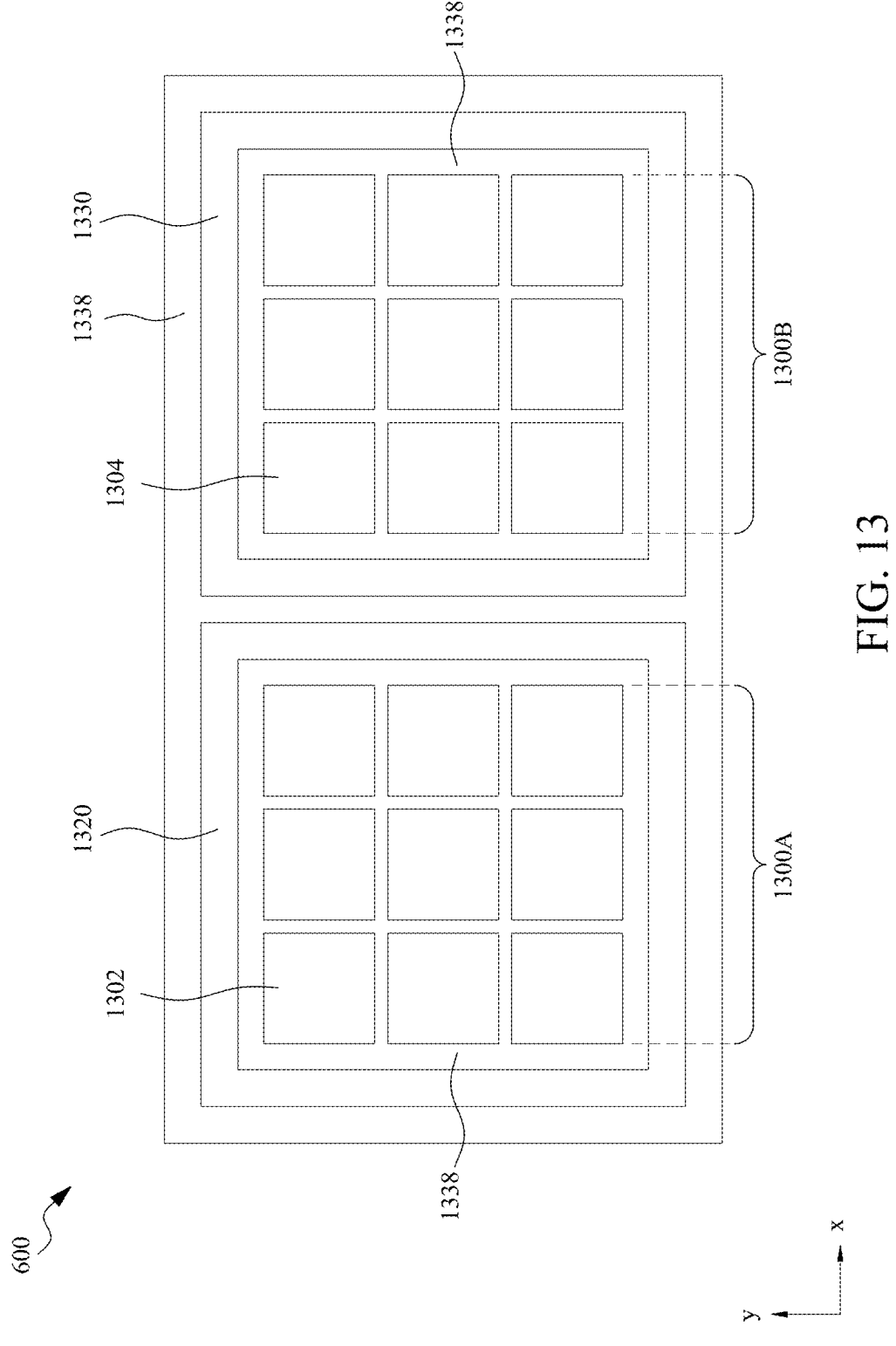
FIG. 13 illustrates a top view of an example memory device with a first memory device portion with a first seal ring structure and a second memory device portion with a second seal ring structure, in accordance with some embodiments.

FIG. 13 is a top view of an example memory device 600 with a first portion of a memory device 1300A laterally enclosed by a first seal ring structure 1320 and a second portion of a memory device 1300B laterally enclosed by a second seal ring structure 1330 (sometimes referred to as a third seal ring structure), in accordance with some embodiments.

The memory device 600 is formed from the method 200 from FIG. 2. The memory device 600 is substantially similar to the memory device 300 but with a first portion 1300A and a second portion 1300B, with each portion containing nine 3D memory arrays 1302 and 1304 and two seal ring structures. In contrast, the memory device 300 includes one portion with one 3D memory array and a single seal ring structure.

The first portion 1300A of the memory device 600 includes at least one memory array 1302 (nine memory arrays are depicted). Each memory array 1302 is a first device portion (e.g., similar to the device portion 930 of FIG. 10) of a memory device. Each memory array includes memory cells formed from a SL, a BL, a portion of semiconductor channel, a memory layer, and a portion of a WL that are similar to the SLs 902, the BLs 904, the semiconductor channels 802A-F, the memory layers 702, and the WLs 634 of the memory device 300, respectively. The memory cells are vertically separated from each other. The first portion 1300A of the memory device 600 also includes one or more first interface portions (e.g., similar to the interface portion 518 of FIG. 10) that are laterally abutted to one side of the first device portion(s). The first portion 1300A is laterally enclosed by the first seal ring structure 1320 which is laterally spaced apart from the first portion 1300A with the IMD 1338 (e.g., similar to the IMD 538 from the memory device 300). The first seal ring structure 1320 is substantially similar to the seal ring structure 920 of the memory device 300.

The second portion 1300B of the memory device 600 also includes at least one memory array 1304 (nine memory arrays are depicted). Each memory array 1304 is a second device portion (e.g., similar to the device portion 930 of FIG. 10) of a memory device. Each memory array includes memory cells formed from a SL, a BL, a portion of semiconductor channel, a memory layer, and a portion of a WL that are similar to the SLs 902, the BLs 904, the semiconductor channels 802A-F, the memory layers 702, and the WLs 634 of the memory device 300, respectively. The memory cells are vertically separated from each other. The second portion 1300B of the memory device 600 also includes one or more second interface portions (e.g., similar to the interface portion 518 of FIG. 10) that are laterally abutted to one side of the second device portion(s). The second portion 1300B is laterally enclosed by the second seal ring structure 1330 (sometimes referred to as the third seal ring structure) which is laterally spaced apart from the first portion 1300A with the IMD 1338 (e.g., similar to the IMD 538 from the memory device 300). The second seal ring structure 1330 is substantially similar to the seal ring structure 920 of the memory device 300. The first seal ring structure 1320 and the second seal ring structure 1330 are separated apart from each other and may be distanced by the IMD 1338. The first seal ring structure 1320 and the second seal ring structure 1330 may be made from the same material as each other and the SLs and BLs in the memory device 600.

In some embodiments, the first portion 1300A and the second portion 1300B may be separate memory devices such as a first memory device and a second memory device, respectively. In such embodiments, the first memory device includes a plurality of memory cells that form a memory string similarly to the first portion 1300A, and the second memory device also includes a plurality of memory cells that form a memory string similarly to the second portion 1300B. Both the first memory device and the second memory device include BLs and SLs that vertically extend and are coupled to the memory cells. The first memory device includes the first seal ring structure 1320, and the second memory device includes the second seal ring structure 1330.

Figure 14:
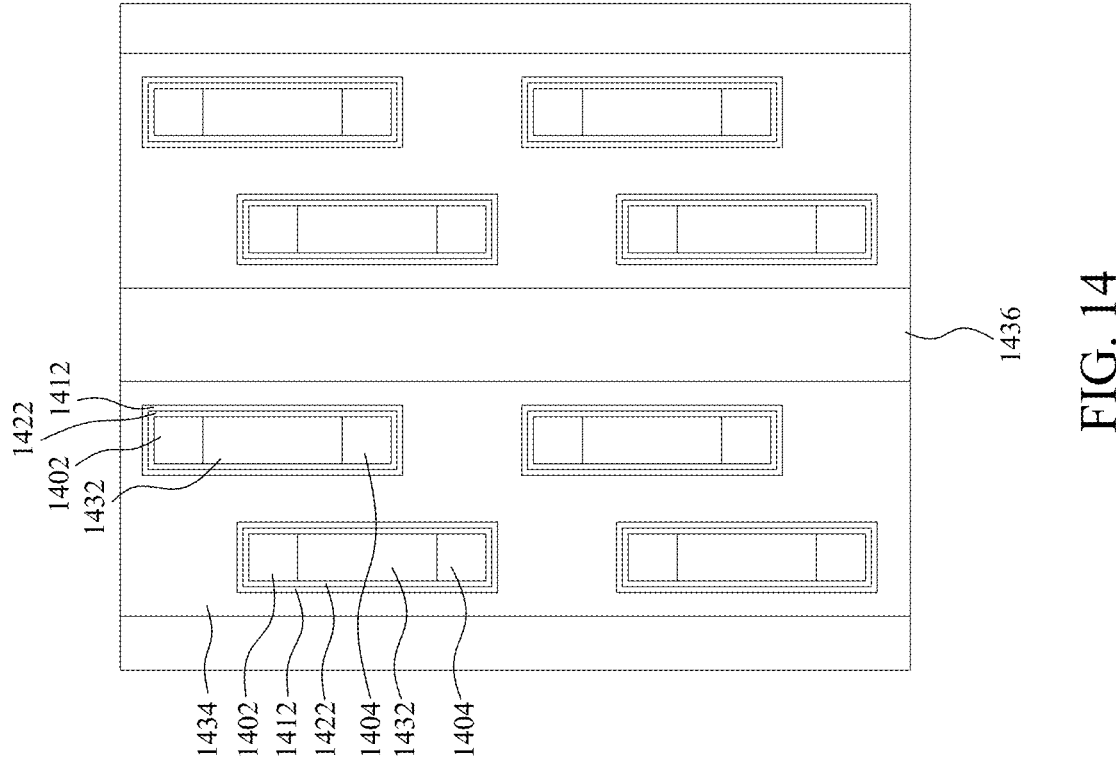
FIG. 14 illustrates a top view of an example memory device with staggered memory cells, in accordance with some embodiments.

FIG. 14 is a top view of a memory array 700 in an example memory device with a staggered memory cell formation, in accordance with some embodiments.

The memory array 700 is formed from the method 200 from FIG. 2. The memory array 700 is substantially similar to the device portion 930 of the memory device 300 but with staggered memory cells.

The memory array 700 includes SLs 1402, BLs 1404, memory layers 1412, semiconductor channel films 1422, inner spacers 1432, WLs 1434, and insulation layers 1436 which are substantially similar to the SLs 902, BLs 904, memory layers 702, semiconductor channel films 802A-F, inner spacers 822, WLs 634, and insulation layers 136, respectively, of the memory device 300 as seen in FIG. 9. In the memory array 700, the memory cells are spaced apart in both the X-direction and the Y-direction. In the Y-direction, the memory cells are spaced from each other in a staggered formation.

FIGS. 15A-D are top views of example memory devices with rounded memory cells, oval-like memory cells, circular memory cells, and square memory cells, respectively, in accordance with some embodiments.

The memory cells in FIGS. 15A-D are formed from the method 200 of FIG. 2. These memory cells are substantially similar to the memory cells of memory device 300 but have shapes that are non-rectangular. Each memory cell in FIGS. 15A-D include a SL 1502, a BL 1504, a memory layer 1512, a semiconductor channel film 1522, an inner spacer 1532, and a WL 1534 which are substantially similar to the SLs 902, BLs 904, memory layers 702, semiconductor channel films 802A-F, inner spacers 822, and WLs 634, respectively, of the memory device 300 as seen in FIG. 9.

Figure 15B:
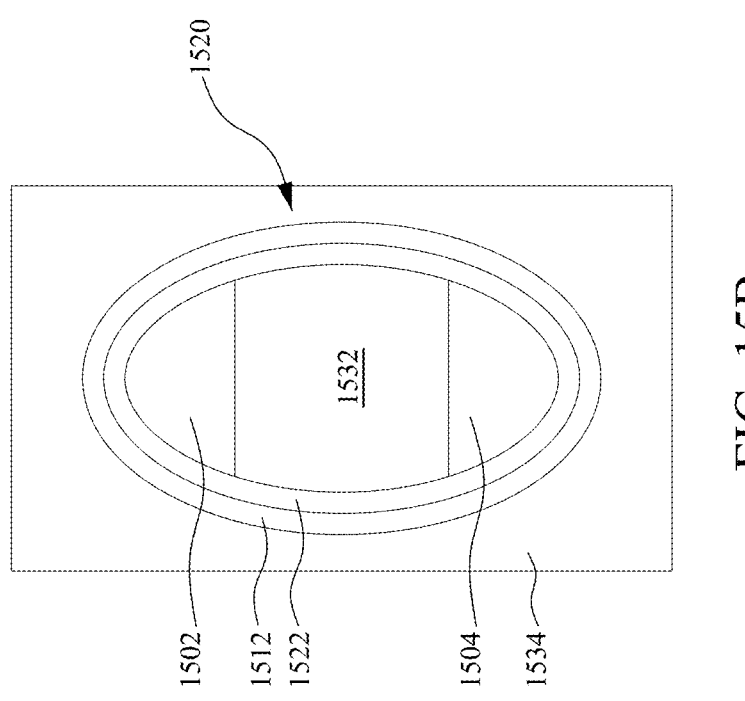
FIGS. 15A-D illustrate top views of example memory devices with rounded rectangular memory cells, oval-like memory cells, circular memory cells, and square memory cells, respectively, in accordance with some embodiments.
Figure 15A:
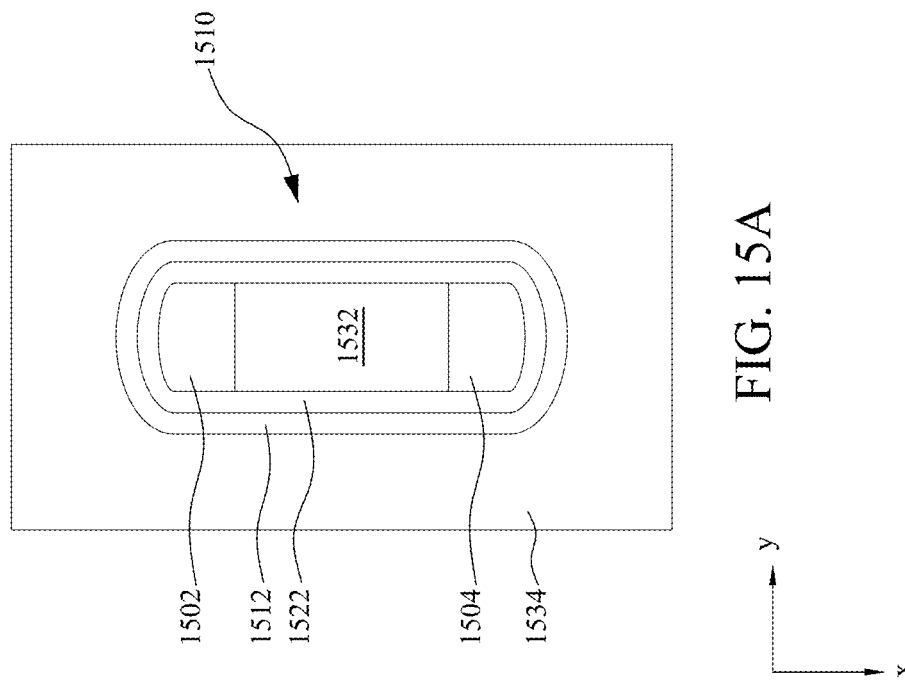
Figures 15C, 15D:
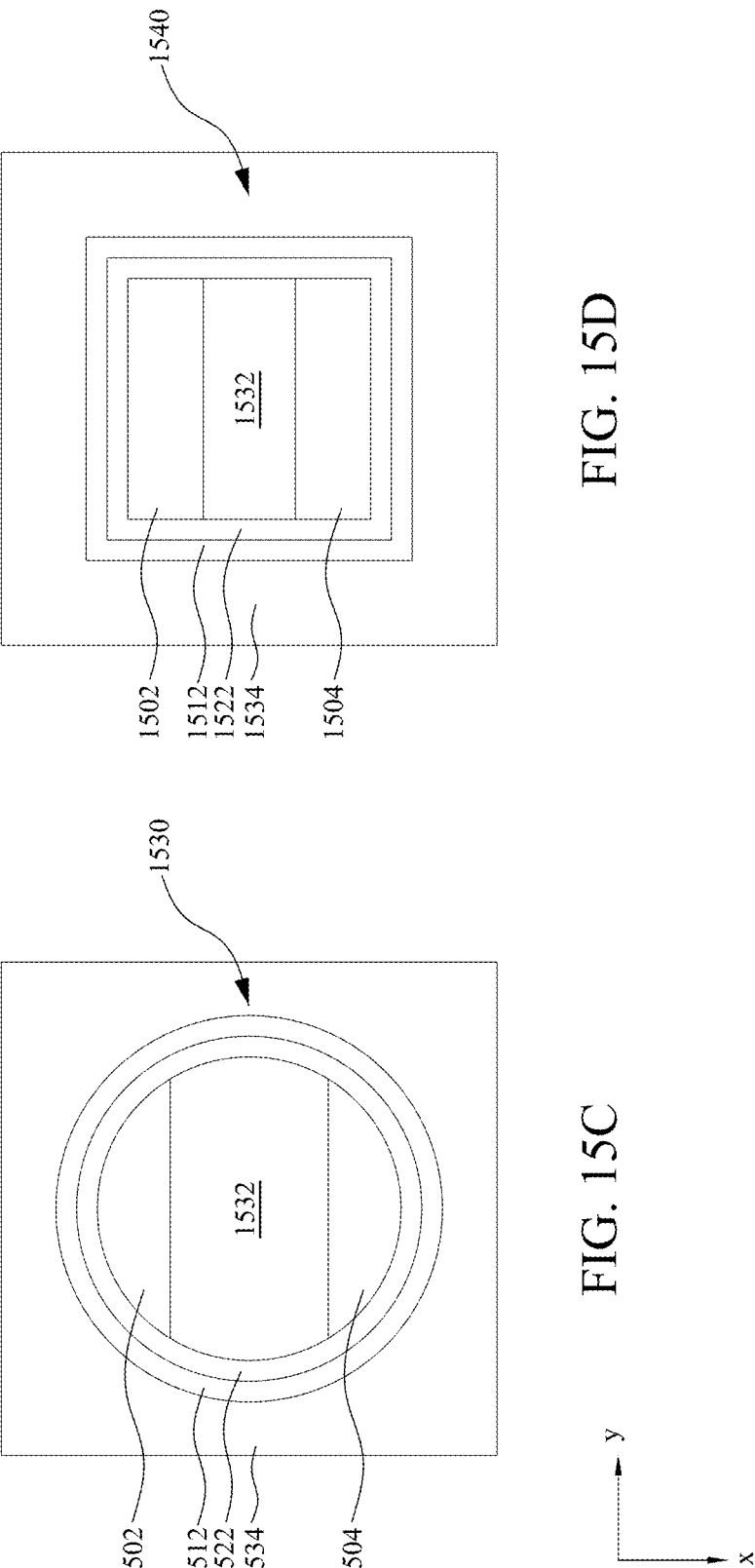

FIG. 15A shows a rounded rectangular memory cell 1510 comprised of the SL 1502, the BL 1504, the memory layer 1512, the semiconductor channel film 1522, the inner spacer 1532, and the WL 1534. FIG. 15B shows an oval-like memory cell 1520 comprised of the SL 1502, the BL 1504, the memory layer 1512, the semiconductor channel film 1522, the inner spacer 1532, and the WL 1534. FIG. 15C shows a circular memory cell 1530 comprised of the SL 1502, the BL 1504, the memory layer 1512, the semiconductor channel film 1522, the inner spacer 1532, and the WL 1534. FIG. 15D shows a square memory cell 1540 comprised of the SL 1502, the BL 1504, the memory layer 1512, the semiconductor channel film 1522, the inner spacer 1532, and the WL 1534. FIGS. 15A-D illustrate that the shape of the memory cell is not limited to a rectangular structure. It is understood that a memory cell in any of the memory devices disclosed is not limited to the shapes disclosed in FIGS. 15A-D and can be any suitable shape.

In one aspect of the present disclosure, a method for fabricating memory devices is disclosed. The method includes forming a first portion of a memory device that includes a first device portion and one or more first interface portions, wherein the first device portion includes a plurality of first memory strings. Each memory string includes a plurality of first memory cells vertically separated from one another. Each of the one or more interface portions, which are laterally abutted to one side of the first device portion, includes a plurality of first word lines (WLs). The method further includes forming a plurality of first source lines (SLs) and a plurality of first bit lines (BLs) in the first device portion. The method further includes forming a first seal ring structure that laterally encloses both the first device portion and the first interface portion concurrently with forming the pluralities of SLs and BLs.

In another aspect of the present disclosure, a method for fabricating memory devices is disclosed. The method includes forming a first memory device that includes a plurality of first memory cells vertically separated from one other. The method further includes forming a second memory device that includes a plurality of memory cells vertically separated from one another. The method further includes concurrently forming a plurality of first access lines that vertically extend and are coupled to the first memory cells, a plurality of second access lines that vertically extend and are coupled to the second memory cells, a first seal ring structure that laterally encloses the first access lines and first memory cells, and a second seal ring structure that laterally encloses the second access lines and second memory cells.

In yet another aspect of the present disclosure, a memory device is disclosed. The memory device includes a plurality of memory strings vertically extending through a stack of alternately arranged word lines (WLs) and insulation layers, wherein each of the plurality of memory strings comprises a plurality of memory cells vertically spaced apart from one another. The memory device further includes a plurality of bit lines (BLs) and a plurality of source lines (SLs) that each vertically extend along a respective one of the memory strings. The memory device further includes a seal ring structure that laterally encloses the plurality of memory strings but is separated from the stack. The plurality of BLs, the plurality of SLs, and the seal ring structure are formed of a same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of first memory strings vertically extending through a first stack of alternately arranged first word lines (WLs) and first insulation layers, wherein each of the plurality of first memory strings comprises a plurality of first memory cells vertically spaced apart from one another;
a plurality of first bit lines (BLs) and a plurality of first source lines (SLs) that each vertically extend along a respective one of the first memory strings; and
a first seal ring structure that laterally encloses the plurality of first memory strings but is separated apart from the first stack;
wherein the plurality of first BLs, the plurality of first SLs, and the first seal ring structure are formed of a same material.

2. The memory device of claim 1, wherein the plurality of first SLs, the plurality of first BLs, and the first seal ring structure each essentially consist of a continuously formed metal material.

3. The memory device of claim 1, wherein the plurality of first SLs, the plurality of first BLs, and the first seal ring structure each essentially consist of a continuously formed semiconductor material.

4. The memory device of claim 1, further comprising:
a plurality of second memory strings vertically extending through a second stack of alternately arranged second WLs and second insulation layers, wherein each of the plurality of second memory strings comprises a plurality of second memory cells vertically spaced apart from one another; and
a plurality of second BLs and a plurality of second SLs that each vertically extend along a respective one of the second memory strings.

5. The memory device of claim 4, wherein at least the first WLs, the first BLs, the first SLs, and the first memory strings form a first memory array, and at least the second WLs, the second BLs, the second SLs, and the second memory strings form a second memory array.

6. The memory device of claim 5, wherein the first seal ring structure laterally encloses both of the first memory array and the second memory array.

7. The memory device of claim 5, further comprising a second seal ring laterally enclosing the first seal ring, with the first seal ring laterally enclosing both of the first memory array and the second memory array.

8. The memory device of claim 5, further comprising a second seal ring laterally enclosing the second memory array.

9. The memory device of claim 1, wherein the first WLs each extend along a direction, and a pair of the first BLs and first SLs corresponding to a respective one of the first memory strings are spaced from each other along the direction.

10. The memory device of claim 1, further comprising:
a plurality of memory films, each of the plurality of memory films surrounding one or more pairs of the first BLs and first SLs.

11. A memory device, comprising:
a plurality of first memory strings vertically extending through a first stack of alternately arranged first word lines (WLs) and first insulation layers, wherein each of the plurality of first memory strings comprises a plurality of first memory cells vertically spaced apart from one another;
a plurality of first bit lines (BLs) and a plurality of first source lines (SLs) that each vertically extend along a respective one of the first memory strings; and
a first seal ring structure that laterally encloses the plurality of first memory strings but is separated apart from the first stack;
wherein the plurality of first BLs, the plurality of first SLs, and the first seal ring structure are formed of a continuously formed material.

12. The memory device of claim 11, further comprising:
a plurality of second memory strings vertically extending through a second stack of alternately arranged second WLs and second insulation layers, wherein each of the plurality of second memory strings comprises a plurality of second memory cells vertically spaced apart from one another; and
a plurality of second BLs and a plurality of second SLs that each vertically extend along a respective one of the second memory strings.

13. The memory device of claim 12, wherein at least the first WLs, the first BLs, the first SLs, and the first memory strings form a first memory array, and at least the second WLs, the second BLs, the second SLs, and the second memory strings form a second memory array.

14. The memory device of claim 13, wherein the first seal ring structure laterally encloses both of the first memory array and the second memory array.

15. The memory device of claim 13, further comprising a second seal ring laterally enclosing the first seal ring, with the first seal ring laterally enclosing both of the first memory array and the second memory array.

16. The memory device of claim 13, further comprising a second seal ring laterally enclosing the second memory array.

17. The memory device of claim 11, wherein the first WLs each extend along a direction, and a pair of the first BLs and first SLs corresponding to a respective one of the first memory strings are spaced from each other along the direction.

18. The memory device of claim 11, further comprising:
a plurality of memory films, each of the plurality of memory films surrounding one or more pairs of the first BLs and first SLs.

19. A memory device, comprising:
a plurality of memory strings vertically extending through a stack of alternately arranged word lines (WLs) and insulation layers, wherein each of the plurality of memory strings comprises a plurality of memory cells vertically spaced apart from one another;
a plurality of bit lines (BLs) and a plurality of source lines (SLs) that each vertically extend along a respective one of the memory strings; and
a seal ring structure that laterally encloses the plurality of memory strings but is separated apart from the stack;
wherein the plurality of BLs, the plurality of SLs, and the seal ring structure are formed of a continuously formed material, and wherein the material is a metal material or a semiconductor material.

20. The memory device of claim 19, wherein the WLs each extend along a direction, and a pair of the BLs and SLs corresponding to a respective one of the memory strings are spaced from each other along the direction.

* * * * *